US009589960B1

(12) United States Patent
Min

(10) Patent No.: US 9,589,960 B1
(45) Date of Patent: Mar. 7, 2017

(54) SEMICONDUCTOR DEVICE HAVING BURIED GATE STRUCTURE, METHOD FOR MANUFACTURING THE SAME, MEMORY CELL HAVING THE SAME, AND ELECTRONIC DEVICE HAVING THE SAME

(71) Applicant: SK hynix Inc., Gyeonggi-do (KR)

(72) Inventor: Kyung-Kyu Min, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/199,320

(22) Filed: Jun. 30, 2016

(30) Foreign Application Priority Data

Dec. 23, 2015 (KR) ........................ 10-2015-0185143

(51) Int. Cl.
*H01L 27/105* (2006.01)
*H01L 29/423* (2006.01)
*H01L 29/51* (2006.01)
*H01L 29/08* (2006.01)
*H01L 29/78* (2006.01)
*H01L 29/66* (2006.01)

(52) U.S. Cl.
CPC ........ *H01L 27/105* (2013.01); *H01L 29/0847* (2013.01); *H01L 29/4236* (2013.01); *H01L 29/513* (2013.01); *H01L 29/517* (2013.01); *H01L 29/6653* (2013.01); *H01L 29/66553* (2013.01); *H01L 29/66666* (2013.01); *H01L 29/7827* (2013.01); *H01L 29/42356* (2013.01)

(58) Field of Classification Search
USPC ........................................................ 438/272
See application file for complete search history.

(56) References Cited

U.S. PATENT DOCUMENTS 8,987,126 B2 * 3/2015 Choi ................. H01L 21/82345
257/391
2007/0082454 A1 4/2007 Stommer et al.
2014/0151791 A1 6/2014 Saino
2015/0214314 A1 * 7/2015 Oh ....................... H01L 29/4236
257/330

FOREIGN PATENT DOCUMENTS

KR 1020160126147 11/2016

OTHER PUBLICATIONS

Kita, K., et al., Origin of electric dipoles formed at high-k/SiO2 interface, Applied Physics Letters, 2009, p. 132902, vol. 94.

* cited by examiner

Primary Examiner — Zandra Smith
Assistant Examiner — Lawrence Tynes, Jr.
(74) Attorney, Agent, or Firm — IP & T Group LLP

(57) ABSTRACT

A method for forming a semiconductor structure includes forming a trench in a semiconductor substrate; forming a first dielectric layer over a bottom surface and sidewalls of the trench; forming a second dielectric layer over the first dielectric layer; forming a sacrificial layer that fills the trench, over the second dielectric layer; etching the sacrificial layer and the second dielectric layer, and forming a sacrificial filler and a dielectric liner that are positioned in the trench; removing the sacrificial filler; forming a conductive layer that fills the trench, over the dielectric liner and the first dielectric layer; and etching the conductive layer to be buried in the trench.

20 Claims, 15 Drawing Sheets

SEMICONDUCTOR DEVICE HAVING BURIED GATE STRUCTURE, METHOD FOR MANUFACTURING THE SAME, MEMORY CELL HAVING THE SAME, AND ELECTRONIC DEVICE HAVING THE SAME

CROSS-REFERENCE TO RELATED APPLICATION

The present application claims priority under 35 U.S.C. §119 to Korean Patent Application No. 10-2015-0185143, filed on Dec. 23, 2015, which is herein incorporated by reference in its entirety.

TECHNICAL FIELD

Exemplary embodiments relate to a semiconductor device, and more particularly, to a semiconductor device having a buried gate structure, a method for manufacturing the same, a memory cell having the same, and an electronic device having the same.

DISCUSSION OF THE RELATED ART

A metal gate electrode is applied for high performance of a transistor. In particular, in a burled gate type transistor, control of a threshold voltage is required for a high performance operation. Also, a gate-induced drain leakage (GIDL) characteristic exerts a substantial influence on performance of a buried gate type transistor.

SUMMARY

Various embodiments are directed to a buried gate structure capable of shifting a threshold voltage, and a method for manufacturing the same.

Also, various embodiments are directed to a semiconductor device capable of improving gate-induced drain leakage (GIDL), and a method for manufacturing the same.

Further, various embodiments are directed to a memory cell capable of improving a refresh characteristic.

Moreover, various embodiments are directed to an electronic device with improved performance.

In an embodiment, a method for forming a semiconductor structure may include: forming a trench in a semiconductor substrate; forming a first dielectric layer over a bottom surface and sidewalls of the trench; forming a second dielectric layer over the first dielectric layer; forming a sacrificial layer which fills the trench, over the second dielectric layer; etching the sacrificial layer and the second dielectric layer, and forming a sacrificial filler and a dielectric liner that are positioned in the trench; removing the sacrificial filler; forming a conductive layer in the trench, over the dielectric liner and the first dielectric layer. The forming of the sacrificial filler and the dielectric liner may include: etching the sacrificial layer to be recessed into the trench from a surface of the semiconductor substrate; and etching the second dielectric layer to be recessed into the trench from the surface of the semiconductor substrate, to have a top surface at the same level as the sacrificial filler. The sacrificial layer may be formed of a material that has an etching selectivity with respect to the second dielectric layer. The conductive layer may include a first portion that contacts the dielectric liner and a second portion that contacts the first dielectric layer. The removing of the sacrificial filler may be performed using a wet etching or a dry etching. The sacrificial layer may include a polysilicon, a metal, a silicon germanium or a combination thereof. The second dielectric layer may include a high work function inducing material. The first dielectric layer may include a silicon oxide ($SiO_2$), and the second dielectric layer may include an aluminum oxide ($Al_2O_3$), a titanium oxide ($TiO_2$), a hafnium oxide ($HfO_2$), a zirconium oxide ($ZrO_2$) or a magnesium oxide (MgO). The second dielectric liner layer may include a material that has a higher dielectric constant than the first dielectric layer.

In an embodiment, a method for forming a semiconductor structure may include: forming a first doping region, a second doping region and a trench between the first doping region and the second doping region in a semiconductor substrate; forming a gate dielectric layer over a surface of the trench; forming a dielectric liner layer over the gate dielectric layer; forming a sacrificial layer which fills the trench, over the liner layer; etching the sacrificial layer and the dielectric liner layer, and forming a sacrificial filler and a dielectric liner that are positioned in the trench; removing the sacrificial filler; forming a conductive layer which fills the trench, over the dielectric liner and the gate dielectric layer; and recessing the conductive layer, and forming a gate electrode that is buried in the trench. The gate dielectric layer and the dielectric liner layer may include materials that contain oxygen, and the dielectric liner layer may include a material that has a higher dielectric constant than the gate dielectric layer. The gate dielectric layer may include a silicon oxide ($SiO_2$) and the liner layer may include a high-k material, and the dielectric liner layer may include a material that has a higher dielectric constant than the silicon oxide. The dielectric liner layer may include a high work function inducing material. The dielectric liner layer may include an aluminum oxide ($Al_2O_3$), a titanium oxide ($TiO_2$), a hafnium oxide ($HfO_2$), a zirconium oxide ($ZrO_2$) or a magnesium oxide (MgO). The forming of the sacrificial filler may include: forming the sacrificial layer which fills the trench, over the dielectric liner layer; and recessing the sacrificial layer to form the sacrificial filler. The sacrificial layer may include a polysilicon, a metal, a silicon germanium or a combination thereof.

In an embodiment, a method for forming a semiconductor structure may include: forming a hard mask layer over a semiconductor substrate; etching the semiconductor substrate by using the hard mask layer as a barrier, and forming a trench; forming a gate dielectric layer over a surface of the trench; forming a first dielectric liner layer over the gate dielectric layer and the hard mask layer; forming a sacrificial layer which fills the trench, over the first dielectric liner layer; etching the sacrificial layer and the first dielectric liner layer, and forming a sacrificial filler and a first dielectric liner that are positioned in the trench; removing the sacrificial filler; forming a second dielectric liner layer over the first dielectric liner and the gate dielectric layer; etching the second dielectric liner layer, and forming a second dielectric liner; forming a metal-base material that contacts the first dielectric liner and the second dielectric liner and fills the trench; and recessing the metal-base material, and forming a gate electrode that is buried in the trench. The first dielectric liner layer and the second dielectric layer may include a material that has a higher dielectric constant than the gate dielectric layer. The first dielectric liner layer may include a high work function inducing material, and the second dielectric liner layer may include a low work function inducing material. The gate dielectric layer may include a silicon oxide ($SiO_2$), and the first dielectric liner layer may include an aluminum oxide ($Al_2O_3$), a titanium oxide ($TiO_2$), a hafnium oxide ($HfO_2$), a zirconium oxide ($ZrO_2$)

or a magnesium oxide (MgO). The gate dielectric layer may include a silicon oxide ($SiO_2$), and the second dielectric liner layer may include an yttrium oxide ($Y_2O_3$), a lanthanum oxide ($La_2O_3$), a germanium oxide ($GeO_2$), a lutetium oxide ($Lu_2O_3$) or a strontium oxide (SrO). The sacrificial layer may include a polysilicon a metal a silicon germanium or a combination thereof.

In an embodiment, a method for forming a semiconductor structure may include: forming a hard mask layer over a semiconductor substrate; etching the semiconductor substrate by using the hard mask layer as a barrier, and forming a trench; forming a gate dielectric layer over a surface of the trench; forming a first dielectric liner layer over the gate dielectric layer and the hard mask layer; forming a sacrificial layer which fills the trench, over the first dielectric liner layer; etching the sacrificial layer and the first dielectric liner layer, and forming a sacrificial filler and a first dielectric liner that are positioned in the trench; removing the sacrificial filler; forming a second dielectric liner layer over the first dielectric liner and the gate dielectric layer; forming a metal-base material which fills the trench, over the second dielectric liner layer; and etching the metal-base material and the second dielectric liner layer, and forming a gate electrode and a second dielectric liner that are buried in the trench. The first dielectric liner layer and the second dielectric liner layer comprises a material that has a higher dielectric constant than the gate dielectric layer. The first dielectric liner layer may include a high work function inducing material, and the second dielectric liner layer may include a low work function inducing material. The gate dielectric layer may include a silicon oxide ($SiO_2$), and the first dielectric liner layer may include an aluminum oxide ($Al_2O_3$) a titanium oxide ($TiO_2$), a hafnium oxide ($HfO_2$), a zirconium oxide ($ZrO_2$) or a magnesium oxide (MgO). The gate dielectric layer may include a silicon oxide ($SiO_2$), and the second dielectric liner layer may include an yttrium oxide ($Y_2O_3$), a lanthanum oxide ($La_2O_3$), a germanium oxide ($GeO_2$), a lutetium oxide ($Lu_2O_3$) or a strontium oxide (SrO). The sacrificial layer may include a polysilicon, a metal, a silicon germanium or a combination thereof.

DETAILED DESCRIPTION

Figure 1:
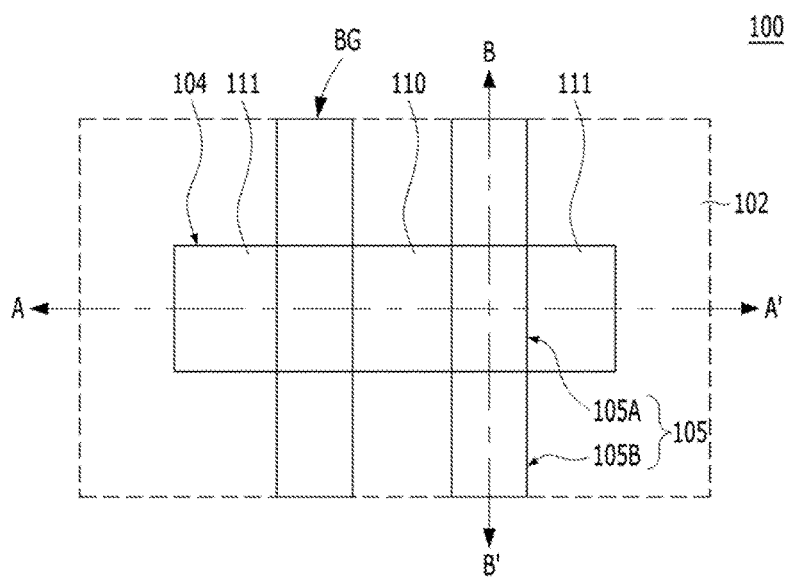
FIG. 1 is a plan view illustrating a semiconductor structure in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate it not only refers to a case where the first layer is formed directly on the second layer or the substrate but also a case in which a third layer exists between the first layer and the second layer or the substrate.

Figure 2A:
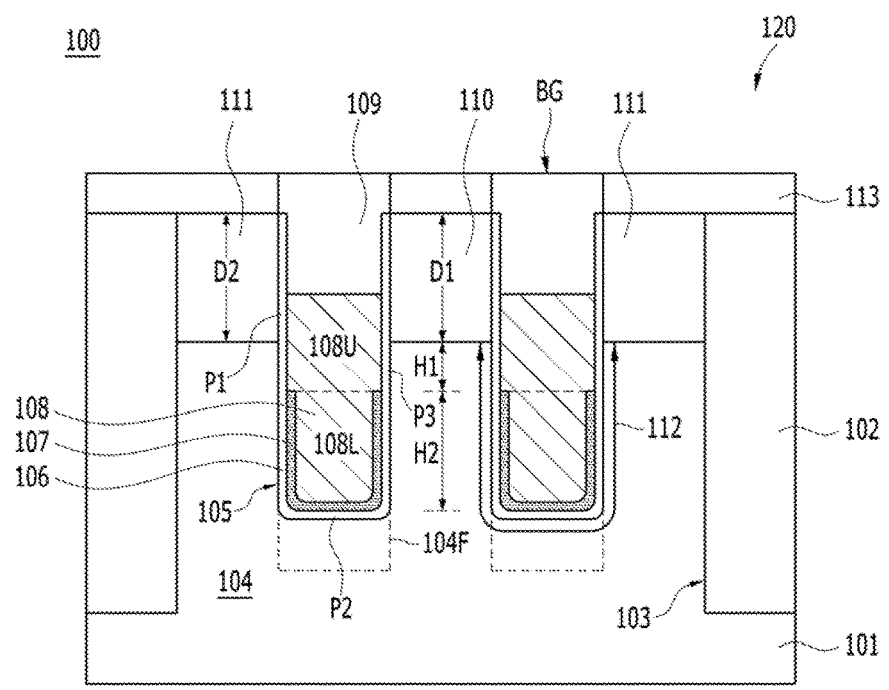
FIG. 2A is a cross-sectional view taken along the line A-A' of FIG. 1.
Figure 2B:
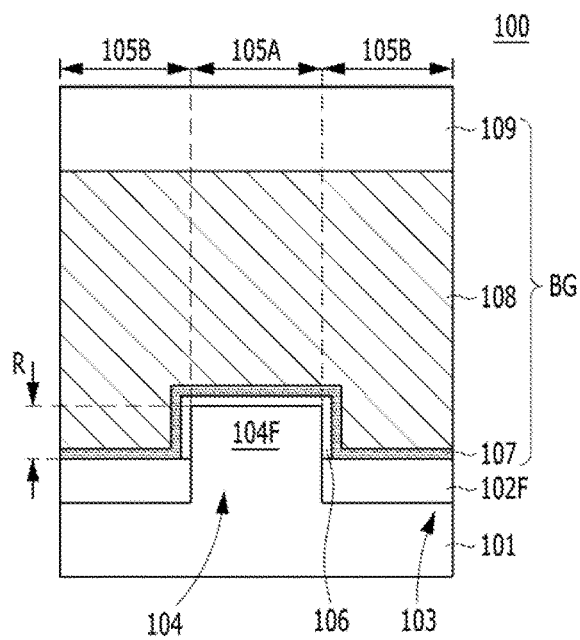
FIG. 2B is a cross-sectional view taken along the line B-B' of FIG. 1.

FIG. 1 is a plan view of a semiconductor structure 100 in accordance with a first embodiment. FIGS. 2A and 2B are cross-sectional views of the semiconductor structure 100 in accordance with the first embodiment FIG. 2A is a cross-sectional view taken along the line A-A' of FIG. 1, and FIG. 2B is a cross-sectional view taken along the line B-B' of FIG. 1.

Referring to FIGS. 1, 2A and 2B, a transistor 120 is shown as a part of the semiconductor structure 100.

The semiconductor structure 100 may include a substrate 101. An isolation region 102 that defines an active region 104 may be formed in the substrate 101. The isolation region 102 may be a shallow trench isolation (STI) region. A buried gate structure BG may extend into the substrate 101. A gate trench 105 may be formed in the substrate 101. The gate trench 105 may include a first portion 105A and a second portion 105B that is continuous from the first portion 105A. The first portion 105A may be formed in the active region 104 and the second portion 105B may be formed in the isolation region 102. The gate trench 105 may be a line shape that traverses the active region 104 and the isolation region 102. The buried gate structure BG may be formed in the gate trench 105. The active region 104 may include a channel region 112, a first doping region 110 and a second doping region 111.

The semiconductor structure 100 may include a transistor. The following embodiments and modifications thereof may be applied to a non-planar transistor, for example, a buried gate type transistor.

The substrate 101 may be a material that is appropriate for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include another semiconductor to material such as germanium. The substrate 101 may include a III/V group semiconductor substrate, for example, a compound semiconductor substrate such as GaAs. The substrate 101 may include a silicon-on-insulator (SOI) substrate.

The isolation region 102 that defines the active region 104 may be formed in the substrate 101. The isolation region 102 may be a STI region. The isolation region 102 may be formed in an isolation trench 103.

The channel region 112 he first and second doping regions 110 and 111 may be formed in the active region 104. The active region 104 may include at least one gate trench 105. Referring to FIG. 1, the gate trench 105 may be a line shape that extends in any one direction. The gate trench 105 may include a bottom and sidewalls. The boundary portions of the bottom and sidewalls of the gate trench 105 may be rounded. The channel region 112 may include a fin region 104F. The fin region 104F may be positioned at the bottom of the gate trench 105. In the gate trench 105, the bottom surfaces of the first trench 105A and the second trench 105B may be positioned at different levels. For example, the bottom surface of the first trench 105A may be positioned at a level higher than the bottom surface of the second trench 105B. The difference between the depths of the first trench 105A and the second trench 105B may be induced as the isolation region 102 is recessed. Accordingly, the second trench 105B may include a recess region R which has a bottom surface lower than the bottom surface of the first trench 105A. The fin region 104F may be formed in the active region 104 due to the difference between the depths of the first trench 105A and the second trench 105B. A channel width may be increased by the fin region 104F. The first and second doping regions 110 and 111 may be formed in the active region 104 on both sides of the gate trench 105. The first and second doping regions 110 and 111 are doped with a conductivity type dopant. For example, a conductivity type dopant may include phosphorus (P), arsenic (As), antimony (Sb) or boron (B). The first and second doping regions 110 and 111 may be doped with the same conductivity type dopant. The first and second doping regions 110 and 111 may be referred to as a source region and a drain region, respectively, The bottom surfaces of the first and second doping regions 110 and 111 may be positioned at a predetermined depth from the top surface of the substrate 101. The first and second doping regions 110 and 111 may contact the sidewalls of the gate trench 105. The bottom surfaces of the first and second doping regions 110 and 111 may be higher than the bottom surface of the gate trench 105. The first and second doping regions 110 and 111 may be symmetrical to each other. For example, the first doping region 110 may form a junction of a first depth D1. The second doping region 111 may form a junction of a second depth D2. The first and second doping regions 110 and 111 may form junctions of the same depth, that is, D1=D2.

The buried gate structure BG may be formed in the gate trench 105. The buried gate structure BG may be simply referred to as an embedded BG. The buried gate structure BG may be positioned in the gate trench 105 between the first doping region 110 and the second doping region 111.

The buried gate structure BG may include a work function adjusting liner 107 and a gate electrode 108. The buried gate structure BG may further include a gate dielectric layer 106 and a capping layer 109. The gate electrode 108 may be positioned at a level lower than the top surface of the substrate 101. The gate electrode 108 may partially fill the gate trench 105. Accordingly, the gate electrode 108 may be referred to as a 'buried gate electrode.' The capping layer 109 may be positioned on the gate electrode 108. The gate dielectric layer 106 may be formed on the bottom and sidewalls of the gate trench 105. The work function adjusting liner 107 may be positioned between the gate electrode 108 and the gate dielectric layer 106.

The gate dielectric layer 106 may include a silicon oxide, a silicon nitride, a silicon oxynitride, a high-k material or a combination thereof. A high-k material may include a material that has a dielectric constant higher than the dielectric constant of a silicon oxide. For example, a high-k material may include a material that has a dielectric constant higher than 3.9. For another example, a high-k material may include a material that has a dielectric constant higher than 10. For still another example, a high-k material may include a material that has a dielectric constant of 10 to 30. A high-k material may include at least one metallic element. A high-k material may include a hafnium-containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used. As the gate dielectric layer 106, an appropriate material may be selected according to the work function adjusting liner 107. For example, as the gate dielectric layer 106, a material that has a lower dielectric constant than the work function adjusting liner 107 may be selected.

The channel length of the channel region 112 may be lengthened by the gate trench 105. The channel region 112 according to the present embodiment has a longer channel length than a conventional planar type transistor. Therefore, a short channel effect may be substantially prevented.

The gate electrode 108 may include a first buried portion 108L and a second buried portion 108U. The first buried portion 108L may fill the lower portion of the gate trench 105, and the second buried portion 108U may fill the gate trench 105 on the first buried portion 108L. The first buried portion 108L may overlap with the channel region 112. A portion of the second buried portion 108U may overlap with the channel region 112, and the other portion of the second buried portion 108U may overlap with the first and second doping regions 110 and 111. Here, the overlap may be in a horizontal direction. The height of the top surface of the second buried portion 108U may be a level lower than the top surface of the substrate 101. The first and second buried portions 108L and 108U are the same material, and may be a low resistivity metal-base material. The first and second buried portions 108L and 108U are distinguished for convenience in description. The first and second buried portions 108L and 108U may be an integral type. The gate electrode 108 may include a low resistivity metal. The gate electrode 108 may include tungsten (W), aluminum (Al) or a combination thereof. In another example, the first and second buried portions 108L and 108U may be formed of different materials. For example, the second buried portion 108U of the gate electrode BG may have a work function lower than the first buried portion 108L.

The work function adjusting liner 107 may be positioned between the first buried portion 108L. of the gate electrode 108 and the gate dielectric layer 106. The top surfaces of the work function adjusting liner 107 and the first buried portion 108L may be at the same level. The work function adjusting liner 107 may not be positioned between the second buried portion 108U and the gate dielectric layer 106. Accordingly, the second buried portion 108U and the gate dielectric layer 106 may directly contact each other. The gate dielectric layer 106 may include a first portion P1 and a second portion P2. The first portion P1 of the gate dielectric layer 106 may directly contact the gate electrode 108 and the first and second doping regions 110 and 111. The second portion P2 of the gate dielectric layer 106 may directly contact the work function adjusting liner 107 and the channel region 112. The gate dielectric layer 106 may further include a third portion P3 between the first portion P1 and the second portion P2. The third portion P3 may directly contact the gate electrode 108 and the channel region 112.

The work function adjusting liner 107 may have a "U" shape. Both top portions of the work function adjusting liner 107 are separated by a first distance from the bottom surfaces of the first and second doping regions 110 and 111. The first distance may be a height corresponding to the third portion P3 of the gate dielectric layer 106.

The capping layer 109 may be filled on the second buried portion 108U. The capping layer 109 protects the gate electrode 108. The capping layer 109 may include a dielectric material. The capping layer 109 may include a silicon nitride, a silicon oxynitride or a combination thereof. In another embodiment, the capping layer 109 may include a combination of a silicon nitride and a silicon oxide. For example to form the capping layer 109, lining may be performed using a silicon nitride, and thereafter, a spin-on-dielectric (SOD) may be filled. In still another embodiment, the capping layer 109 may be a tri-layer including N(nitride)-O(oxide)-N(nitride).

A hard mask layer 113 may be formed on the first and second doping regions 110 and 111. The hard mask layer 113 may be extended to cover the top of the isolation region 102. The hard mask layer 113 may include a silicon oxide such as a tetra-ethyl-ortho-silicate (TEOS).

The work function adjusting liner 107 will be described below in detail.

The work function adjusting liner 107 may be a dielectric material. Accordingly, the resistivity of the buried gate structure BG may be reduced. The work function adjusting liner 107 may be a high-k material that has a dielectric constant higher than the gate dielectric layer 106. The work function adjusting liner 107 may induce a high work function between the first buried portion 108L and the channel region 112. A high work function is a work function higher than the mid-gap work function of silicon. A low work function is a work function lower than the mid-gap work function of silicon. Therefore, a high work function may be a work function higher than 4.5 eV, and a low work function may be a work function lower than 4.5 eV. The work function adjusting liner 107 may include a material that generates a dipole between the channel region 112 and the first buried portion 108L and induces a high work function due to a change of an energy band. To generate the dipole, the work function adjusting liner 107 and the gate dielectric layer 106 may have different dielectric constant. The work function adjusting liner 107 may be formed of a higher dielectric constant metal oxide that has a dielectric constant higher than the gate dielectric layer 106. When the gate dielectric layer 106 is $SiO_2$, the work function adjusting liner 107 may include a material that has a dielectric constant higher than $SiO_2$. A material that has a dielectric constant higher than $SiO_2$ may include an aluminum oxide ($Al_2O_3$), a titanium oxide ($TiO_2$), a hafnium oxide ($HfO_2$), a zirconium oxide ($ZrO_2$) or a magnesium oxide (MgO). A material that has a dielectric constant lower than $SiO_2$ may include an yttrium oxide ($Y_2O_3$), a lanthanum oxide ($La_2O_3$), a germanium oxide ($GeO_2$), a lutetium oxide ($Lu_2O_3$) or a strontium oxide (SrO). The work function adjusting liner 107 may be formed to a thin thickness. Therefore, it is possible to significantly decrease the resistivity of the gate electrode 108 by increasing the volume of the gate electrode 108.

According to the first embodiment, the work function adjusting liner 107 is a material that induces a high work function. A threshold voltage is modulated by the work function adjusting liner 107. For example, a threshold voltage may be shifted by the work function adjusting liner 107. The dipole may be generated at the interface of the work function adjusting liner 107 and the gate dielectric layer 106. The dipole may be generated by a difference of oxygen areal densities between the work function adjusting liner 107 and the gate dielectric layer 106. Such a dipole may induce a high work function between the first buried portion 108L of the gate electrode 108 and the channel region 112. Accordingly, the dipole may shift a threshold voltage. As a result, the channel dose of the channel region 112 may be decreased by the work function adjusting liner 107. By controlling the polarity direction of the dipole, it is possible to control a work function. By such a dipole, a high work function or a low work function may be induced. For example, in the case in which the work function adjusting liner 107 has a dielectric constant higher than the gate dielectric layer 106, a dipole may be generated in a direction in which a high work function is induced. When the work function adjusting liner 107 has a dielectric constant lower than the gate dielectric layer 106, a dipole may be generated in a direction in which a low work function is induced. Since the work function adjusting liner 107 has a dielectric constant higher than the gate dielectric layer 106, a dipole may be generated in a direction where a change is made to a high work function. Such a dipole may cause a shift of a threshold voltage. For example, when an aluminum oxide $Al_2O_3$ is applied, a threshold voltage shift of about +0.57V may be caused.

Since the gate trench 105 has a high aspect ratio, it is difficult to perform sufficient doping to the bottom portion of the gate trench 105 or the fin region 104F by channel doping generally known in the art. Therefore, after channel doping, additional channel doping is locally performed for the bottom portion of the gate trench 105 or the fin region 104F, and this is referred to as 'local channel doping.' When implantation is adopted as local channel doping, the implantation is referred to as local channel implantation (LCI).

Since a threshold voltage may be modulated by the work function adjusting liner 107, a dose of local channel doping (LCI) may be remarkably decreased or local channel doping (LCI) may be omitted. Hence, in the present embodiment, since a channel dose may be decreased, a junction leakage characteristic may be improved.

Additionally, since the gate electrode 108 or the second buried portion 108U has a low work function it is possible to suppress gate-induced drain leakage (GIDL) in the first and second doping regions 110 and 111. When the work function adjusting liner 107 overlaps with the first and second doping regions 110 and 111, gate-induced drain leakage (GIDL) may increase due to induction of a high work function. Thus, the work function adjusting liner 107 may be modulated in its height not to overlap with the first and second doping regions 110 and 111. For example, the work function adjusting liner 107 may be separated by a first height H1 from the first and second doping regions 110 and 111. The work function adjusting liner 107 may overlap with the channel region 112 by a second height H2. The second height H2 may be larger than the first height H1.

Figure 3:
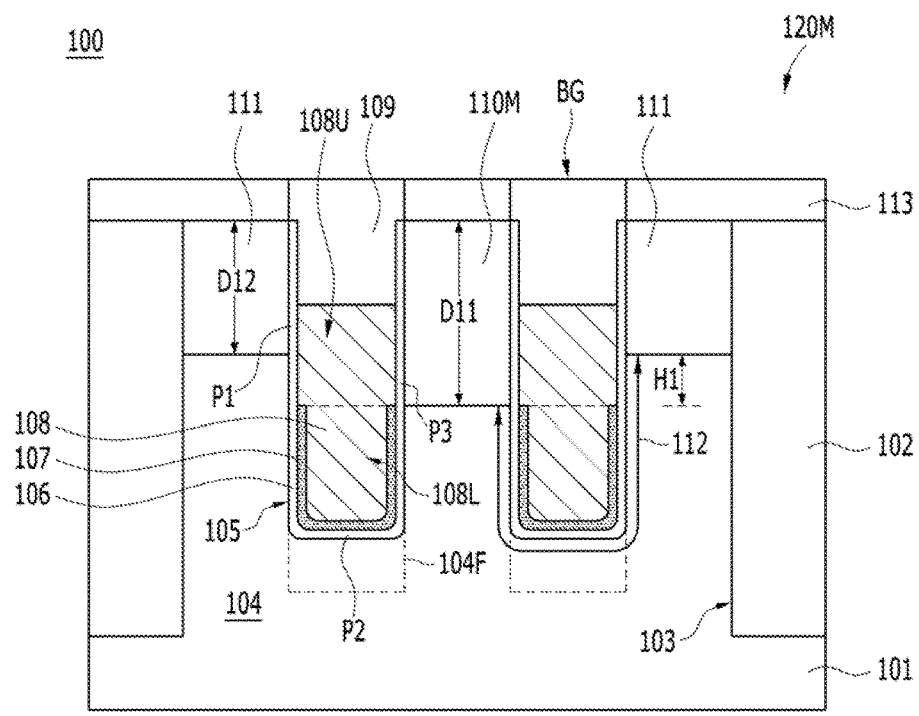
FIG. 3 is a view illustrating a semiconductor structure in to accordance with a modification of the first embodiment.

FIG. 3 illustrates a semiconductor structure 100 in accordance with a modification of the first embodiment.

Referring to FIG. 3, a transistor 120M is shown as a part of a semiconductor structure 100. Components of the semiconductor structure 100 shown in FIG. 3 may be the same as those of the semiconductor structure 100 described with reference to FIGS. 1 to 2B except for a first doping region 110M.

The transistor 120M may include the first doping region 110M and a second doping region 111. The first and second doping regions 110M and 111 may be an asymmetrical structure. The first doping region 110M may form a deeper junction than the second doping region 111, and the second doping region 111 may form a shallower junction than the first doping region 110M. For example, the first doping region 110M may be formed to a first depth D11, and the second doping region 111 may be formed to a second depth D12. The first depth D11 may be deeper than the second depth D12. The first doping region 110M may overlap completely with the second buried portion 108U of the gate electrode 108. The second doping region 111 may overlap partially with the second buried portion 108U of the gate electrode 108. Both top portions of a work function adjusting liner 107 may be separated by a first height H1 from the second doping region 111, and may not overlap with the second doping region 111. The surfaces of both top portions of the work function adjusting liner 107 may be at the same level as the bottom surface of the first doping region 110M. The surfaces of both top portions of the work function adjusting liner 107 may be at a level lower than the bottom surface of the second doping region 111.

As described above, the first doping region 110M may not overlap with the work function adjusting liner 107, and the second doping region 111 may not overlap with the work function adjusting liner 107. In another example, the first doping region 110M may overlap with the work function adjusting liner 107, and the second doping region 111 may not overlap with the work function adjusting liner 107.

Figure 4:
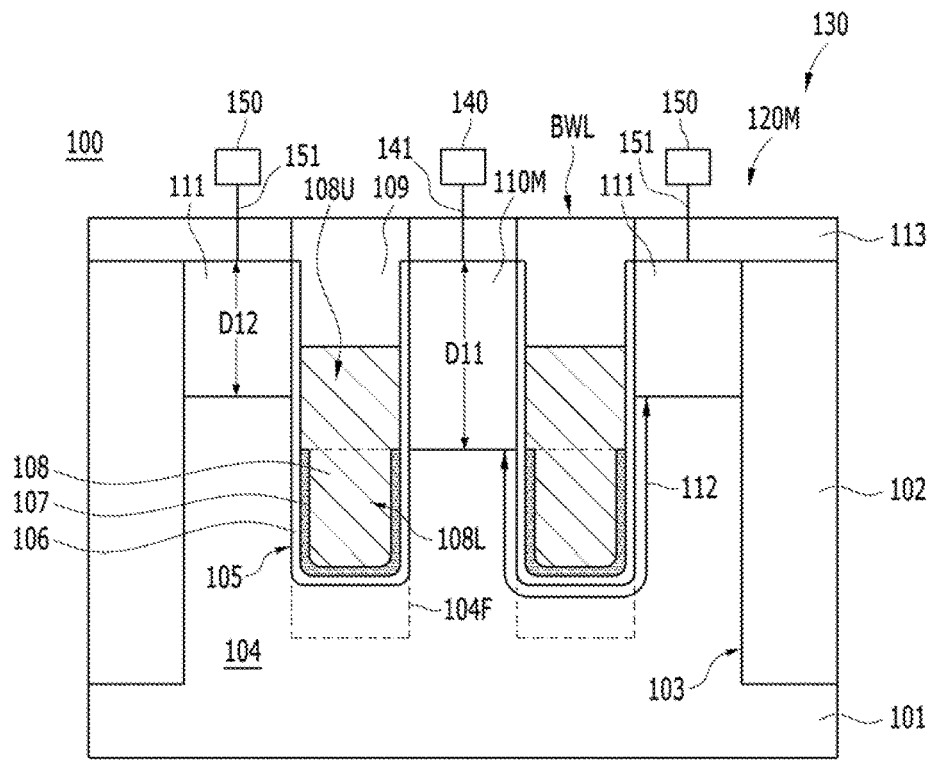
FIG. 4 is a view illustrating an example of an application of the semiconductor structure in accordance with the first embodiment.

FIG. 4 is a view illustrating an application of the semiconductor structure in accordance with the first embodiment.

Referring to FIG. 4, a memory cell 130 is shown as a part of a semiconductor structure 100. The memory cell 130 may include a transistor 120M, a bit line 140, and a memory element 150. The transistor 120M may be the transistor 120M of FIG. 3. Therefore the transistor 120M may include a buried gate structure BG, a first doping region 110M and a second doping region 111. The first doping region 110M may be electrically coupled to the bit line 140 through a first contact 141. The second doping region 111 may be electrically coupled to the memory element 150 through a second contact 151. The memory element 150 may include a capacitor. The buried gate structure BG may be referred to as a buried word line structure BWL.

The transistor 120M may be replaced with the transistor 120 described with reference to FIGS. 1 to 2B.

FIGS. 5A to 5I illustrate a method for manufacturing the semiconductor structure in accordance with the first embodiment. FIGS. 5A to 5I are cross-sectional views taken in correspondence to the line A-A' of FIG. 1.

Figure 5A:
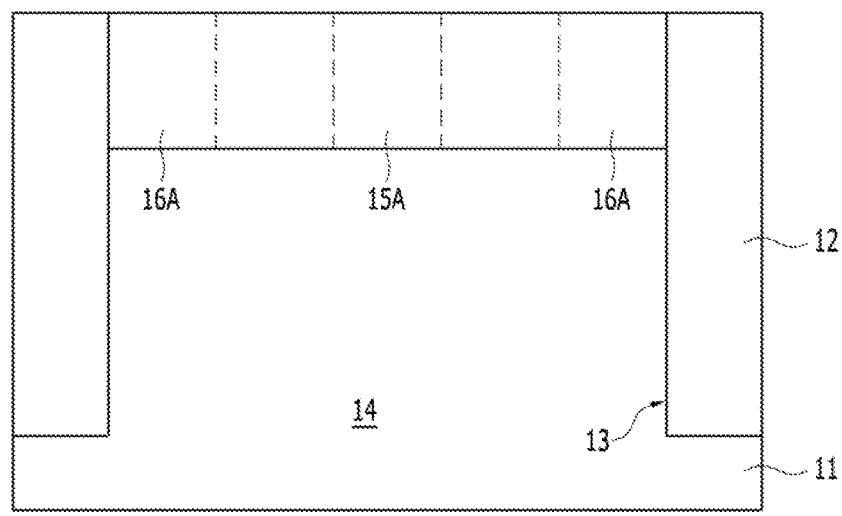
FIGS. 5A to 5I illustrate a method for manufacturing the semiconductor structure in accordance with the first embodiment.

As shown in FIG. 5A, an isolation layer 12 is formed in a substrate 11. An active region 14 is defined by the isolation layer 12. The isolation layer 12 may be formed by a shallow trench isolation (STI) process. For example, after forming a pad layer (not shown) on the substrate 11, the pad layer and the substrate 11 are etched using an isolation mask (not shown). Therefore, an isolation trench 13 is formed. The isolation trench 13 is filled with a dielectric material, and thus, the isolation layer 12 is formed. The isolation layer 12 may include a silicon oxide, a silicon nitride or a combination thereof. Chemical vapor deposition (CVD) or another deposition process may be used to fill the isolation trench 13 with a dielectric material. A planarization process such as chemical mechanical polishing (CMP) may be additionally used.

Next, a pre-first doping region 15A and a pre-second doping region 16A may be formed in the active region 14. The pre-first doping region 15A and the pre-second doping region 16A may be doped with the same dopant. The pre-first doping region 15A and the pre-second doping region 16A may be formed to the same depth.

Figure 5B:
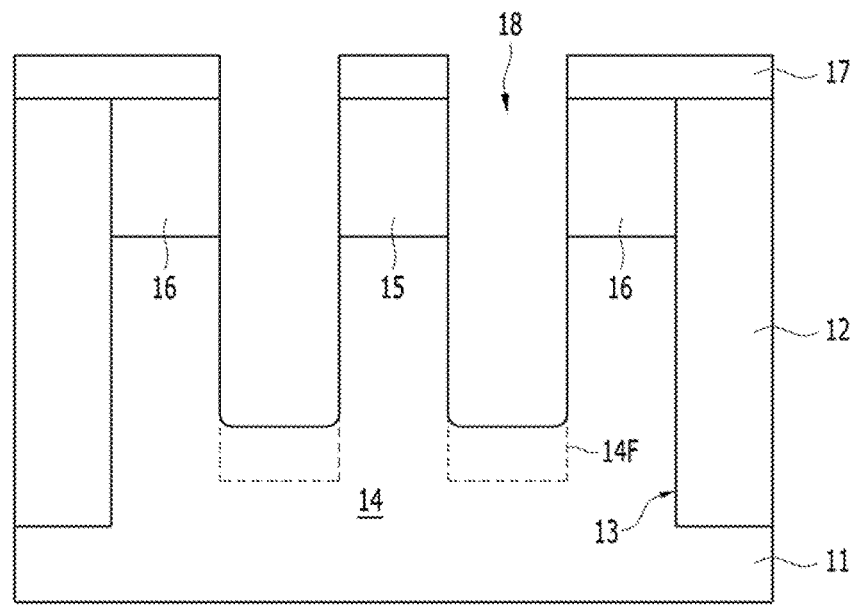

As shown in FIG. 5B, a hard mask layer 17 may be formed on the substrate 11. The hard mask layer 17 may be formed of a material that has an etching selectivity with respect to the substrate 11. The hard mask layer 17 may include a silicon oxide. The hard mask layer 17 may include TEOS.

A gate trench 18 is formed in the substrate 11. The gate trench 18 may have a line shape that traverses the active region 14 and the isolation layer 12. The gate trench 18 may be formed by forming a mask pattern (not shown) on the substrate 11 and performing an etching process using the mask pattern as an etch mask. The gate trench 18 may be formed shallower than the isolation trench 13. The gate trench 18 may have a sufficient depth to increase the average cross-sectional area of a subsequent gate electrode. Accordingly, the resistivity of the gate electrode may be reduced. The bottom of the gate trench 18 may have a curvature. By forming the bottom of the gate trench 18 to have a curvature, prominences and depressions may be minimized at the bottom of the gate trench 18, and accordingly, filling of the gate electrode may be easily performed. Furthermore, by forming the bottom of the gate trench 18 to have a curvature, angled corners may be removed at the bottom of the gate trench 18, whereby electric field enhancement may be alleviated. A first doping region 15 and a second doping region 16 may be separated from each other by the gate trench 18. That is, the pre-first doping region 15A and the pre-second doping region 16A may become the first and second doping regions 15 and 16 by the gate trench 18. The first and second doping regions 15 and 16 may have the same depth.

A fin region 14F is formed. The fin region 14F may be formed by recessing the isolation layer 12 (see FIG. 2B).

Figure 5C:
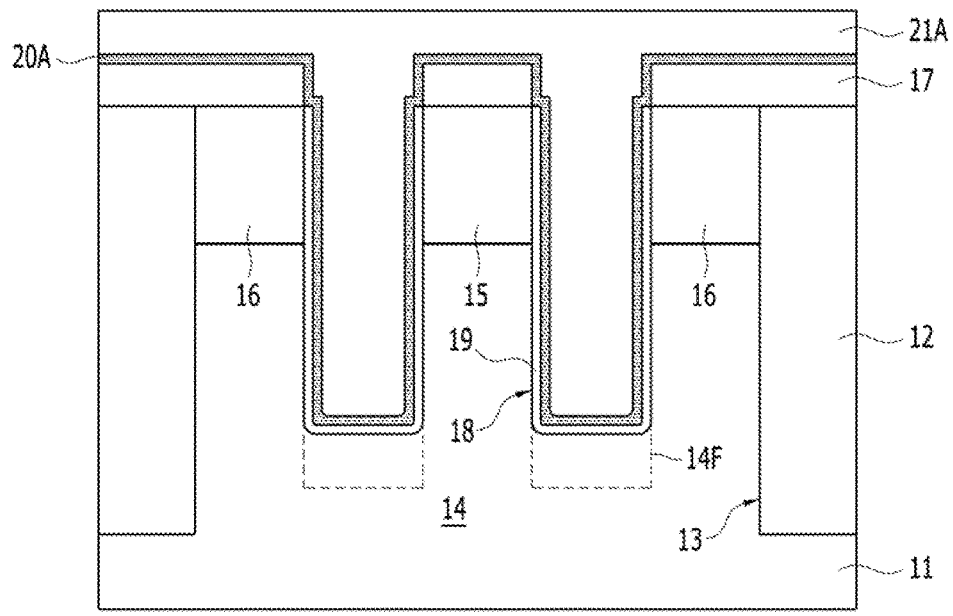

As shown in FIG. 5C, a gate dielectric layer 19 may be formed on the surface of the gate trench 18. Before forming the gate dielectric layer 19, etch damage to the surface of the gate trench 18 may be recovered. For example, after forming a sacrificial oxide by thermal oxidation processing, the sacrificial oxide may be removed.

The gate dielectric layer 19 may be formed by a thermal oxidation process. In another embodiment, the gate dielectric layer 19 may be formed by chemical vapor deposition (CVD) or atomic layer deposition (ALD). The gate dielectric layer 19 may include a high-k material, an oxide, a nitride, an oxynitride or a combination thereof. A high-k material may include a hafnium-containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used.

In another embodiment, the gate dielectric layer 19 may be formed by depositing a liner polysilicon layer and then performing radical oxidation of the liner polysilicon layer.

In still another embodiment the gate dielectric layer 19 may be formed by forming a liner silicon nitride layer and then performing radical oxidation of the liner silicon nitride layer.

A work function adjusting liner layer 20A may be formed on the gate dielectric layer 19. The work function adjusting liner layer 20A may be formed conformally on the surface of the gate dielectric layer 19. The work function adjusting liner layer 20A is a material for modulating a work function. The work function adjusting liner layer 20A may include a material that generates a dipole at the interface of the gate dielectric layer 19 and the work function adjusting liner layer 20A and induces a high work function characteristic due to a change of an energy band. The work function adjusting liner layer 20A may be formed of a material that has a dielectric constant higher than $SiO_2$. The work function adjusting liner layer 20A may include an aluminum oxide ($Al_2O_3$), a titanium oxide ($TiO_2$), a hafnium oxide ($HfO_2$), a zirconium oxide ($ZrO_2$) or a magnesium oxide (MgO). In the present embodiment, the work function adjusting liner layer 20A may include $Al_2O_3$. As the aluminum oxide is applied as the work function adjusting liner layer 20A, a stable interfacial state may be retained between the work function adjusting liner layer 20A and the gate dielectric layer 19. The work function adjusting liner layer 20A may be formed to a thin thickness.

A sacrificial layer 21A may be formed on the work function adjusting liner layer 20A. The sacrificial layer 21A may fill the gate trench 18. The sacrificial layer 21A may fill the gate trench 18 without a void. The sacrificial layer 21A may be formed of a material that has an etching selectivity with respect to the work function adjusting liner layer 20A. The sacrificial layer 21A may include polysilicon, a metal, silicon germanium or a combination thereof. The sacrificial layer 21A may be formed by chemical vapor deposition (CVD) or atomic layer deposition (ALD).

Figure 5D:
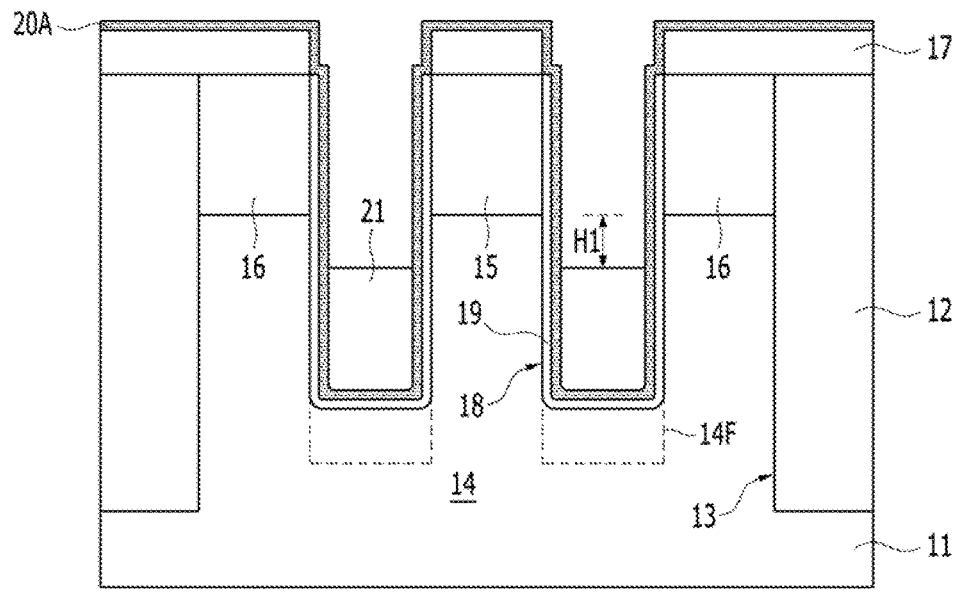

As shown in FIG. 5D, a recessing process for the sacrificial layer 21A is performed such that a sacrificial filler 21 remains in the gate trench 18. The recessing process for the sacrificial layer 21A may be performed by dry etching, for example, an etch-back process. The sacrificial filler 21 may be formed by an etch-back process for the sacrificial layer 21A.

In another embodiment, the recessing process for the sacrificial layer 21A may be performed in such a manner that, after planarization process is first performed, an etch-back process is performed subsequently.

The sacrificial filler 21 is formed by the recessing process for the sacrificial layer 21A, as described above. The sacrificial filler 21 may be recessed to be lower than the top surface of the active region 14. For example, the sacrificial filler 21 may be separated by a first height H1 from the first and second doping regions 15 and 16.

After forming the sacrificial filler 21 a portion of the work function adjusting liner layer 20A may be exposed.

While forming the sacrificial filler 21 as described above, the gate dielectric layer 19 may be protected by the work function adjusting liner layer 20A. For example, a portion of the gate dielectric layer 19 that is not covered by the sacrificial filler 21 is not lost. Accordingly, a sufficient thickness of the gate dielectric layer 19 may be retained. Further, while forming the sacrificial filler 21, the hard mask layer 17 may be protected by the work function adjusting liner layer 20A. Accordingly, a decrease in the thickness of the hard mask layer 17 does not occur. When the work function adjusting liner layer 20A does not exist, the hard mask layer 17 may be lost while forming the sacrificial filler 21. Accordingly, a process variation may increase resulting in damage to the first and second doping regions 15 and 16.

Figure 5E:
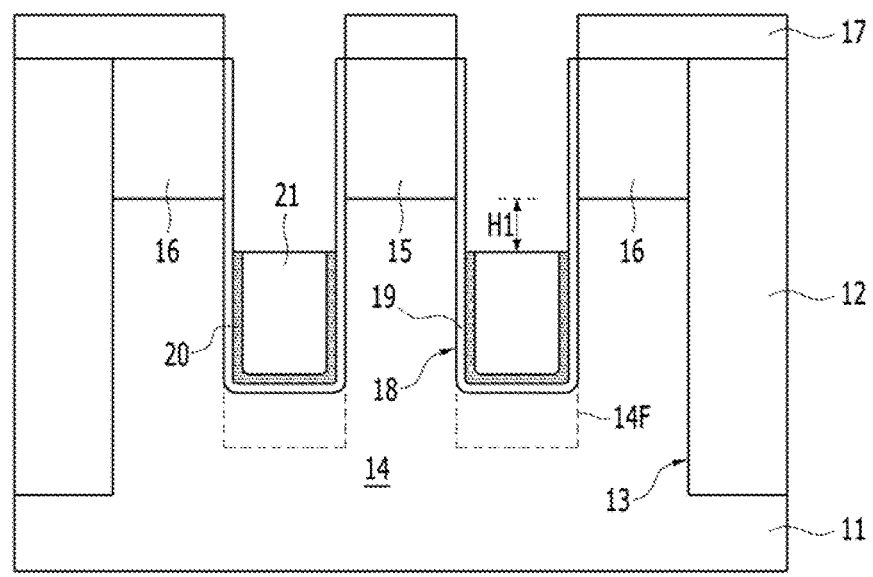

As shown in FIG. 5E the work function adjusting liner layer 20A may be removed selectively. For example, the exposed portion of the work function adjusting liner layer 20A may be removed. Accordingly, work function adjusting liner layer 20 may be formed. A recessing process is performed such that the work function adjusting liner 20 remains in the gate trench 18, The recessing process may be performed by dry etching or wet etching. The work function adjusting liner 20 may be formed by an etch-back process for the work function adjusting liner layer 20A. The recessing process may be performed without an attack to the gate dielectric layer 19. The work function adjusting liner 20 may be positioned between the sacrificial filler 21 and the gate dielectric layer 19. The heights of the top surfaces of the work function adjusting liner 20 and the sacrificial filler 21 may be at the same level.

The work function adjusting liner 20 may be separated by the first height H1 from the first and second doping regions 15 and 16. The first height H1 may define a non-overlap portion between the work function adjusting liner 20 and the first and second doping regions 15 and 16.

The recessing process for the work function adjusting liner layer 20A has an etching selectivity with respect to the gate dielectric layer 19. Accordingly, loss of the gate dielectric layer 19 is prevented.

Figure 5F:
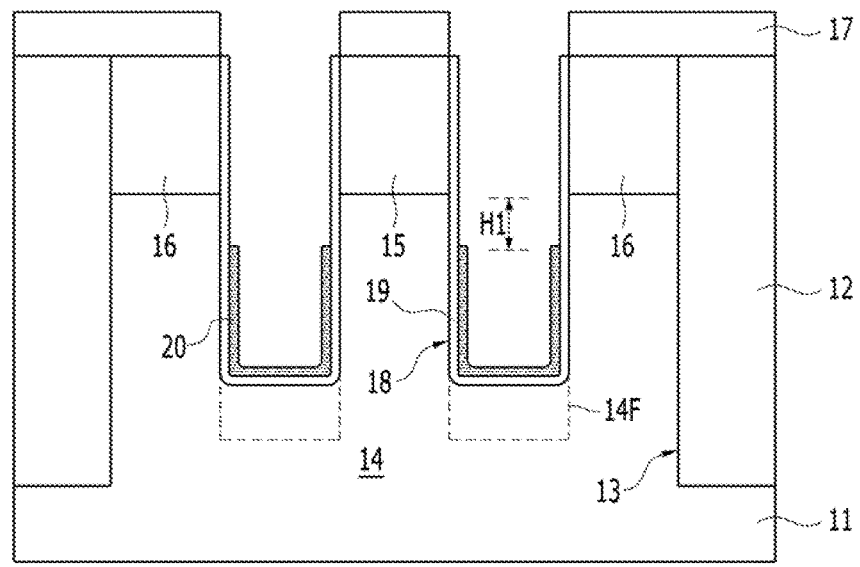

As shown in FIG. 5F, the sacrificial filler 21 may be removed. When removing the sacrificial filler 21, the work function adjusting liner 20 and the gate dielectric layer 19 are not attacked. The sacrificial filler 21 may be removed by dry etching or wet etching.

By removing the sacrificial filler 21. the work function adjusting liner 20 and the gate dielectric layer 19 may remain in the gate trench 18. The work function adjusting liner 20 may have a "U" shape. The work function adjusting liner 20 may include both top portions that neighbor the first and second doping regions 15 and 16. Both top portions of the work function adjusting liner 20 may be separated by the first height H1 from the first and second doping regions 15 and 16.

Figure 5G:
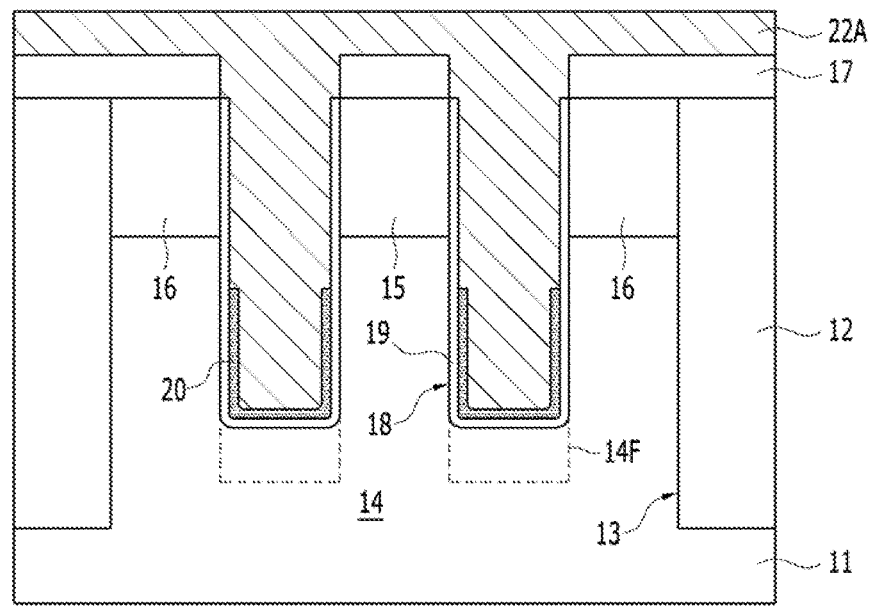

As shown in FIG. 5G, a pre-buried layer 22A may be formed. The pre-buried layer 22A may fill the gate trench 18 on the work function adjusting liner 20. The pre-buried layer 22A may be formed of a material that has low resistivity and a low work function. The pre-buried layer 22A may include a low resistivity metal. The pre-buried layer 22A may include a tungsten layer. The pre-buried layer 22A may be formed to have a 'TiN/W' structure by stacking a titanium nitride and a tungsten layer.

Figure 5H:
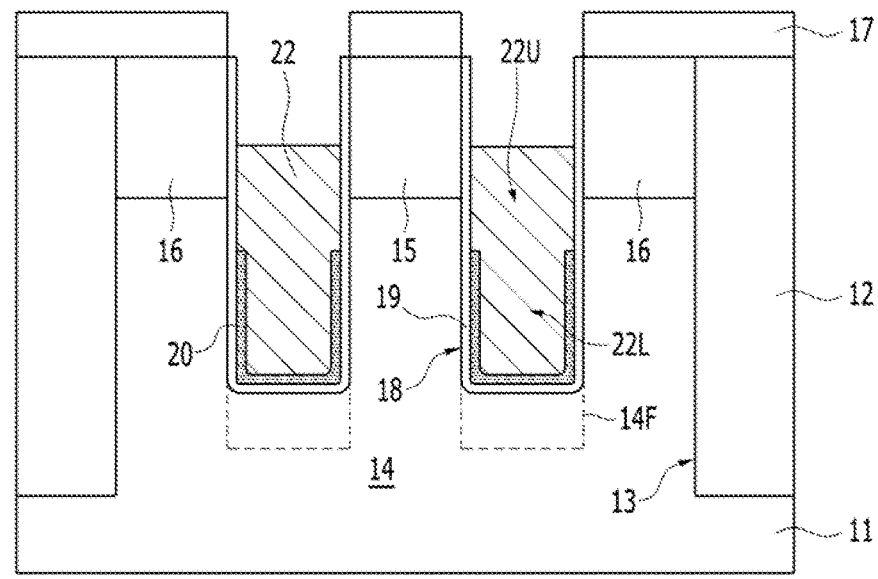

As shown in FIG. 5H, a buried portion 22 may be formed. To form the buried portion 22, the pre-buried layer 22A may be etched by an etch-back process. The buried portion 22 may be at a level lower than the top surface of the active region 14. Accordingly, the buried portion 22 positioned or embedded in the gate trench 18 may be formed.

The buried portion 22 may include a first portion 22L and a second portion 22U. The first portion 22L may fill a lower portion of the gate trench 18. The second portion 22U may be positioned on the first portion 22L and overlap with the first and second doping regions 15 and 16. The work function adjusting liner 20 may be positioned between the first portion 22L of the buried portion 22 and the gate dielectric layer 19. The work function adjusting liner 20 may not be positioned between the second portion 22U of the buried portion 22 and the gate dielectric layer 19. The first portion 22L of the buried portion 22 may be separated by the first height H1 from the first and second doping regions 15 and 16. That is, the first portion 22L of the buried portion 22 may not overlap with the first and second doping regions 15 and 16. Since the buried portion 22 includes a low work function material and the second portion 22U of the buried portion 22 overlaps with the first and second doping regions 15 and 16, GIDL may be improved.

Figure 5I:
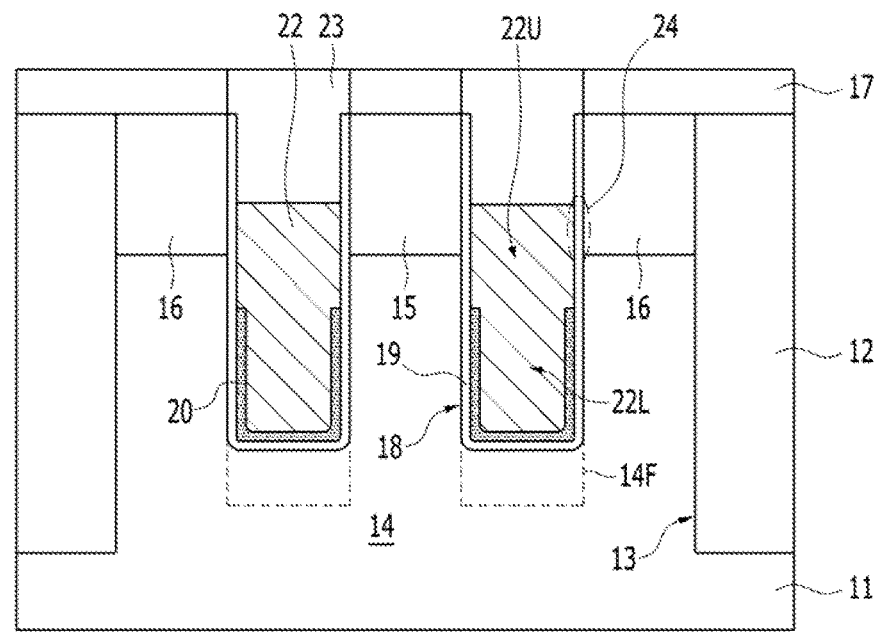

As shown in FIG. 5I, a capping layer 23 is formed on the buried portion 22. The capping layer 23 includes a dielectric material. On the buried portion 22, the gate trench 18 is filled with the capping layer 23. The capping layer 23 may include a silicon nitride. Subsequently, planarization of the capping layer 23 may be performed such that the top surface of the substrate 11 is exposed. In another embodiment, the capping layer 23 may include a silicon oxide. In still another embodiment, the capping layer 23 may be a nitride-oxide-nitride (NON) structure.

By forming the capping layer 23, a buried gate structure is formed. The buried gate structure includes the gate dielectric layer 19, the work function adjusting liner 20, the buried portion 22 and the capping layer 23. The buried portion 22 may include the first and second portions 22L and 22U. The work function adjusting liner 20 may be positioned between the first portion 22L of the buried portion 22 and the gate dielectric layer 19. The top surface of the buried portion 22 is positioned at a lower level than the top surface of the substrate 11. In this way, as the top surface of the buried portion 22 is recessed to be low, a physical distance between the buried portion 22 and a nearby conductor for example, a contact plug may be sufficiently secured. As a result, the working voltage between the buried portion 22 and the nearby conductor may be improved. The first and second doping regions 15 and 16 may have a depth that overlaps with the second portion 22U of the buried portion 22. The work function adjusting liner 20 may not overlap with the first and second doping regions 15 and 16.

According to the above descriptions, during the etch-back process for forming the buried portion 22, a portion 24 of the gate dielectric layer 19 that overlaps with the first and second doping regions 15 and 16 is not lost. Since the buried portion 22 is modulated in height to overlap with the first and second doping regions 15 and 16, the portion 24 of the gate dielectric layer 19 is not lost.

Figure 6:
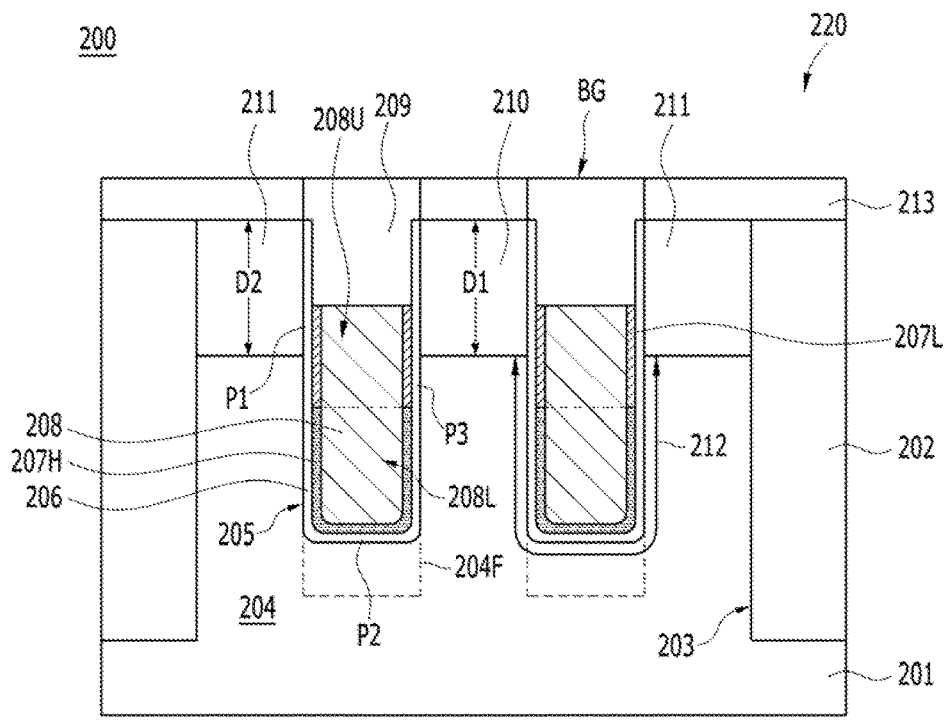
FIG. 6 is a view illustrating a semiconductor structure in accordance with a second embodiment.

FIG. 6 illustrates a semiconductor structure in accordance with a second embodiment. A transistor 220 is shown as a part of a semiconductor structure 200.

The semiconductor structure 200 may include a substrate 201. An isolation region 202 that defines an active region 204 may be formed in the substrate 201. The isolation region 202 may be an STI region, A buried gate structure BG may extend into the substrate 201. A gate trench 205 may be formed in the substrate 201. The gate trench 205 may be a line shape that traverses the active region 204 and the isolation region 202. The buried gate structure BG may be formed in the gate trench 205. The active region 204 may include a channel region 212, a first doping region 210 and a second doping region 211.

The semiconductor structure 200 may include a transistor. The following embodiments and modifications thereof may be applied to a non-planar transistor, for example, a buried gate type transistor.

The substrate 201 may be a material that is appropriate for semiconductor processing. The substrate 201 may include a semiconductor substrate. The substrate 201 may be formed of a silicon-containing material. The substrate 201 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 201 may include another semiconductor material such as germanium. The substrate 201 may include a III/V group semiconductor substrate, for example, a compound semiconductor substrate such as GaAs. The substrate 201 may include a silicon-on-insulator (SOI) substrate.

The isolation region 202 that defines the active region 204 may be formed in the substrate 201. The isolation region 202 may be a STI region. The isolation region 202 may be formed in an isolation trench 203.

The channel region 212 and the first and second doping regions 210 and 211 may be formed in the active region 204. The channel region 212 may include the gate trench 205. The gate trench 205 may be a line shape that extends in any one direction. The gate trench 205 may include a bottom and sidewalls. The boundary portions of the bottom and sidewalls may be rounded. The channel region 212 may include a fin region 204F. The fin region 204F may be positioned at the bottom of the gate trench 205. The fin region 204F may be formed as the isolation region 202 is recessed to be lower than the bottom of the gate trench 205. A channel width may be increased by the fin region 204F. The first and second doping regions 210 and 211 may be formed in the active region 204 on both sides of the gate trench 205. The first and second doping regions 210 and 211 are doped with a conductivity type dopant. For example, a conductivity type dopant may include phosphorus (P), arsenic (As), antimony (Sb) or boron (B). The first and second doping regions 210 and 211 may be doped with the same conductivity type dopant. The first and second doping regions 210 and 211 may be referred to as a source region and a drain region, respectively. The bottom surfaces of the first and second doping regions 210 and 211 may be positioned at a predetermined depth from the top surface of the substrate 201. The first and second doping regions 210 and 211 may contact the sidewalls of the gate trench 205. The bottom surfaces of the first and second doping regions 210 and 211 may be higher than the bottom surface of the gate trench 205. The first and second doping regions 210 and 211 may be symmetrical to each other. For example, the first and second doping regions 210 and 211 may form junctions of the same depth that is, D1=D2.

The buried gate structure BG may be formed in the gate trench 205. The buried gate structure BG may be simply referred to as an embedded BG. The buried gate structure BG may be positioned in the gate trench 205 between the first and second doping regions 210 and 211.

The buried gate structure BG may include a first work function adjusting liner 207H and a gate electrode 208. The buried gate structure BG may further include a gate dielectric layer 206 and a capping layer 209. The gate electrode 208 may be positioned at a level lower than the top surface of the substrate 201. The gate electrode 208 may partially fill the gate trench 205. Accordingly, the gate electrode 208 may be referred to as a 'buried gate electrode.' The capping layer 209 may be positioned on the gate electrode 208. The gate dielectric layer 206 may be formed on the bottom and sidewalls of the gate trench 205. The first work function adjusting liner 207H may be positioned between the gate electrode 208 and the gate dielectric layer 206.

The gate dielectric layer 206 may include a silicon oxide a silicon nitride, a silicon oxynitride, a high-k material or a combination thereof. A high-k material may include a material that has a dielectric constant higher than the dielectric constant of a silicon oxide. For example a high-k material may include a material that has a dielectric constant higher than 3.9. For another example, a high-k material may include a material that has a dielectric constant higher than 10. For still another example, a high-k material may include a material that has a dielectric constant of 10 to 30. A high-k material may include at least one metallic element. A high-k material may include a hafnium-containing material. A hafnium-containing material may include a hafnium oxide a hafnium silicon oxide a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used. As the gate dielectric layer 206, an appropriate material may be selected according to the first work function adjusting liner 207H. For example, as the gate dielectric layer 206, a material that has a lower dielectric constant than the first work function adjusting liner 207H may be selected.

The channel length of the channel region 212 may be lengthened by the gate trench 205. The channel region 212 according to the present embodiment has a longer channel length than a conventional planar type transistor. Therefore a short channel effect may be substantially prevented.

The gate electrode 208 may include a first buried portion 208L and a second buried portion 208U. The first buried portion 208L may fill the lower portion of the gate trench 205, and the second burled portion 208U may fill the gate trench 205 on the first buried portion 208L. The first buried portion 208L may overlap with the channel region 212. A portion of the second buried portion 208U may overlap with the channel region 212, and the other portion of the second buried portion 208U may overlap with the first and second doping regions 210 and 211. The overlap may be in a horizontal direction. The height of the top surface of the second buried portion 208U may be a level lower than the top surface of the substrate 201. The first buried portion 208L and the second buried portion 208U are the same material, and may be a low resistivity metal-base material. The first buried portion 208L and the second buried portion 208U are distinguished for the sake of convenience in description. The first buried portion 208L and the second buried portion 208U may be an integral type. The gate electrode 208 may include a low resistivity metal. The gate electrode 208 may include tungsten (W), aluminum (Al) or a combination thereof.

The first work function adjusting liner 207H may be positioned between the first buried portion 208L of the gate electrode 208 and the gate dielectric layer 206. The top surfaces of the first work function adjusting liner 207H and the first buried portion 208L may be of the same level. A second work function adjusting liner 207L may be positioned between the second buried portion 208U and the gate dielectric layer 206. The top surfaces of the second work function adjusting liner 207L and the second buried portion 208U may be of the same level.

The first work function adjusting liner 207H may have a U shape. The top portions of the first work function adjusting liner 207H may be separated from the first and second doping regions 210 and 211.

The capping layer 209 may be filled on the second buried portion 208U. The capping layer 209 plays the role of protecting the gate electrode 208. The capping layer 209 may include a dielectric material The capping layer 209 may include a silicon nitride a silicon oxynitride or a combination thereof. In another embodiment, the capping layer 209 may include a combination of a silicon nitride and a silicon oxide. For example, to form the capping layer 209, lining may be performed using a silicon nitride, and thereafter, a spin-on-dielectric (SOD) may be filled. In still another embodiment, the capping layer 209 may be a tri-layer including N(nitride)-O(oxide)-N(nitride).

A hard mask layer 213 may be formed on the first and second doping regions 210 and 211. The hard mask layer 213 may be extended to cover the top of the isolation region 202. The hard mask layer 213 may include a silicon oxide such as a tetra-ethyl-ortho-silicate (TEOS).

The first and second work function adjusting liners 207H and 207L will be described below in detail.

The first work function adjusting liner 207H may not overlap with the first and second doping regions 210 and 211. The second work function adjusting liner 207L may overlap with the first and second doping regions 210 and 211.

The first and second work function adjusting liners 207H and 207L may be dielectric materials. Accordingly, the resistivity of the buried gate structure BG may be reduced. The first and second work function adjusting liners 207H and 207L may be high-k materials that have dielectric constant higher than the gate dielectric layer 206. The first work function adjusting liner 207H may induce a high work function between the first buried portion 208L and the channel region 212. The second work function adjusting liner 207L may induce a low work function between the second buried portion 208U and the first and second doping regions 210 and 211. The first work function adjusting liner 207H may generate a dipole that induces a high work function between the channel region 212 and the first buried portion 208L. The second work function adjusting liner 207L may generate a dipole that induces a low work function between the first and second doping regions 210 and 211 and the second buried portion 208U.

To generate the dipole, the first work function adjusting liner 207H and the gate dielectric layer 206 may have different dielectric constant. The first work function adjusting liner 207H may be formed of a higher dielectric constant metal oxide that has a dielectric constant higher than the gate dielectric layer 206. The second work function adjusting liner 207L may be formed of a higher dielectric constant metal oxide that has a dielectric constant higher than the gate dielectric layer 206. When the gate dielectric layer 206 is $SiO_2$, the first work function adjusting liner 207H may include a material that has a dielectric constant higher than $SiO_2$. When the gate dielectric layer 206 is $SiO_2$, the second work function adjusting liner 207L may include a material that has a dielectric constant higher than $SiO_2$. The first work function adjusting liner 207H may include an aluminum oxide ($Al_2O_3$), a titanium oxide ($TiO_2$), a hafnium oxide ($HfO_2$), a zirconium oxide ($ZrO_2$) or a magnesium oxide (MgO). The second work function adjusting liner 207L may include an yttrium oxide ($Y_2O_3$), a lanthanum oxide ($La_2O_3$), a germanium oxide ($GeO_2$), a lutetium oxide ($Lu_2O_3$) or a strontium oxide (SrO). The first and second work function adjusting liners 207H and 207L may be formed to a thin thickness. Therefore, it is possible to significantly decrease the resistivity of the gate electrode 208 by increasing the volume of the gate electrode 208.

According to the second embodiment, the first work function adjusting liner 207H is a material that induces a high work function. A threshold voltage is modulated by the first work function adjusting liner 207H. For example, a threshold voltage may be shifted by the first work function adjusting liner 207H. The dipole may be generated at the interface of the first work function adjusting liner 207H and the gate dielectric layer 206. The dipole may be generated by a difference of oxygen areal densities between the first work function adjusting liner 207H and the gate dielectric layer 206. Such a dipole may induce a high work function between the first buried portion 208L of the gate electrode 208 and the channel region 212. Accordingly, the dipole may shift a threshold voltage. As a result, the channel dose of the channel region 212 may be decreased by the first work function adjusting liner 207H. When the second work function adjusting liner 207L has a dielectric constant higher than the gate dielectric layer 206, the dipole may be generated in a direction in which a low work function is induced between the second buried portion 208U and the first and second doping regions 210 and 211. Accordingly, GIDL may be improved.

Since a threshold voltage may be modulated by the first work function adjusting liner 207H, a dose of local channel doping (LCI) may be remarkably decreased or local channel doping (LCI) may be omitted. Hence, in the present embodiment, since a channel dose may be decreased, a junction leakage characteristic may be improved.

Additionally, since the second work function adjusting liner 207L is included, it is possible to suppress gate-induced drain leakage (GIDL) in the first and second doping regions 210 and 211.

Figure 7:
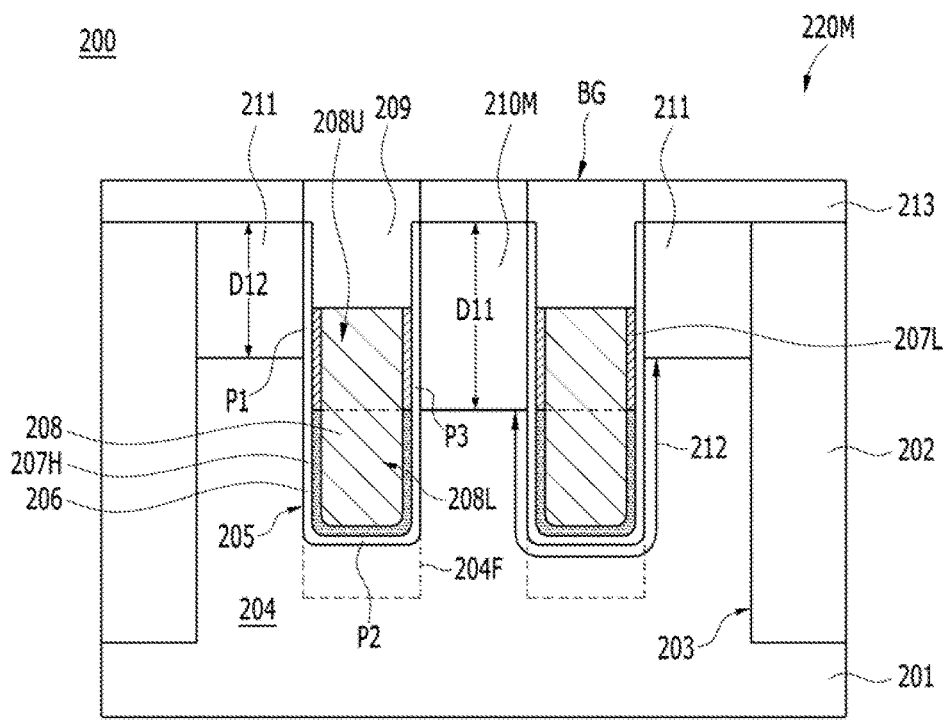
FIG. 7 illustrates a semiconductor structure in accordance with a modification of the second embodiment.

FIG. 7 illustrates a semiconductor structure 200 in accordance with a modification of the second embodiment.

Referring to FIG. 7, a transistor 220M is shown as a part of the semiconductor structure 200. Components of the semiconductor structure 200 shown in FIG. 7 may be the same as those of the semiconductor structure 200 described with reference to FIG. 6 except for a first doping region 210M.

The transistor 220M may include the first doping region 210M and a second doping region 211. The first and second doping regions 210M and 211 may be an asymmetrical structure. The first doping region 210M may form a deeper junction than the second doping region 211, and the second doping region 211 may form a shallower junction than the first doping region 210M. For example, the first doping region 210M may be formed to a first depth D11, and the second doping region 211 may be formed to a second depth D12. The first depth D11 may be deeper than the second depth D12. The first and second doping regions 210M and 211 may overlap with a second work function adjusting liner 207L. The first and second doping regions 210M and 211 may non-overlap with a first work function adjusting liner 207H.

Figure 8:
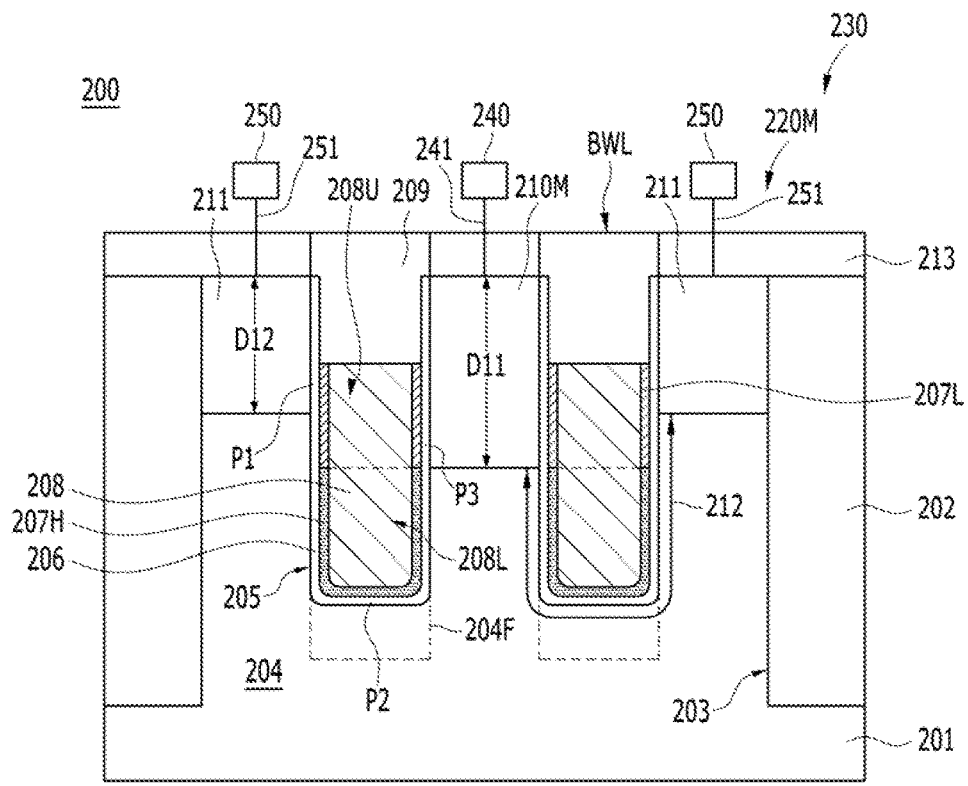
FIG. 8 is a view illustrating an application of the semiconductor structure in accordance with the second embodiment.

FIG. 8 is a view illustrating an application of the semiconductor structure in accordance with the second embodiment.

Referring to FIG. 8 a memory cell 230 is shown as a part of a semiconductor structure 200. The memory cell 230 may include a transistor 220M, a bit line 240, and a memory element 250. The transistor 220M may be the transistor 220M of FIG. 7. Therefore, the transistor 220M may include a buried gate structure BG, a first doping region 210M and a second doping region 211. The first doping region 210M may be electrically coupled to the bit line 240 through a first contact 241. The second doping region 211 may be electrically coupled to the memory element 250 through a second contact 251. The memory element 250 may include a capacitor. The buried gate structure BG may be referred to as a buried word line structure BWL.

The transistor 220M may be replaced with the transistor 220 described with reference to FIG. 6.

FIGS. 9A to 9E illustrate a method for manufacturing the semiconductor structure in accordance with the second embodiment. The second embodiment describes a first work function adjusting liner and a second work function adjusting liner. The first work function adjusting liner may be the same as the work function adjusting liner of the first embodiment.

As shown in FIGS. 5A to 5F, a work function adjusting liner 20 may be formed through a series of processes. Hereinbelow, in the second embodiment, the work function adjusting liner 20 will be referred to as a first work function adjusting liner 20. By the first work function adjusting liner 20, a dipole interface that induces a high work function may be formed between a buried portion and a channel. Accordingly, the first work function adjusting liner 20 may be referred to as a high work function inducing material or a first dipole forming material.

Figure 9A:
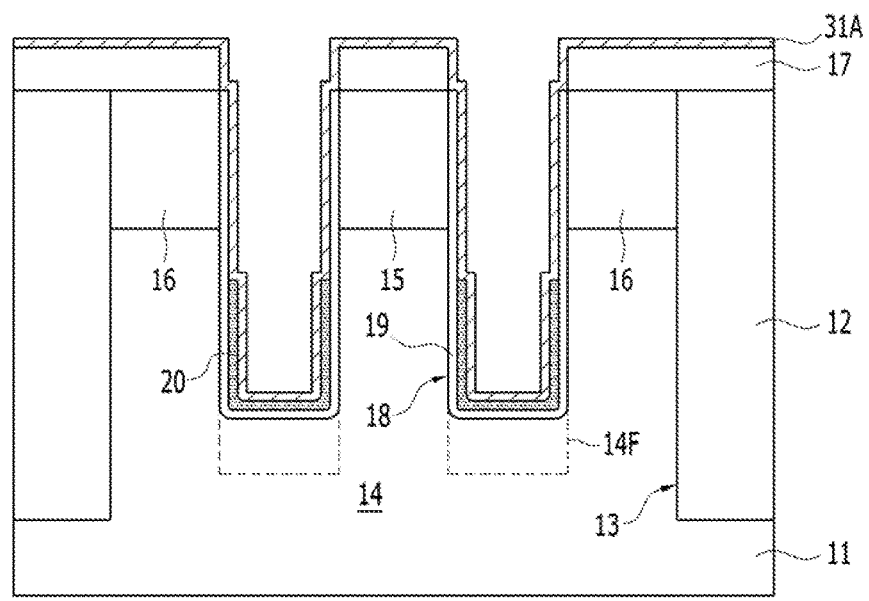
FIGS. 9A to 9E illustrate a method for manufacturing a semiconductor structure in accordance with the second embodiment.

As shown in FIG. 9A, a second work function adjusting liner layer 31A may be formed on the first work function adjusting liner 20. The second work function adjusting liner layer 31A may be a material that is different from the first work function adjusting liner 20. By the second work function adjusting liner layer 31A, a dipole interface that induces a low work function may be formed between the buried portion and first and second doping regions 15 and 16. The second work function adjusting liner layer 31A may include a dielectric material. The second work function adjusting liner layer 31A may be a material that has a dielectric constant lower than a gate dielectric layer 19.

Figure 9B:
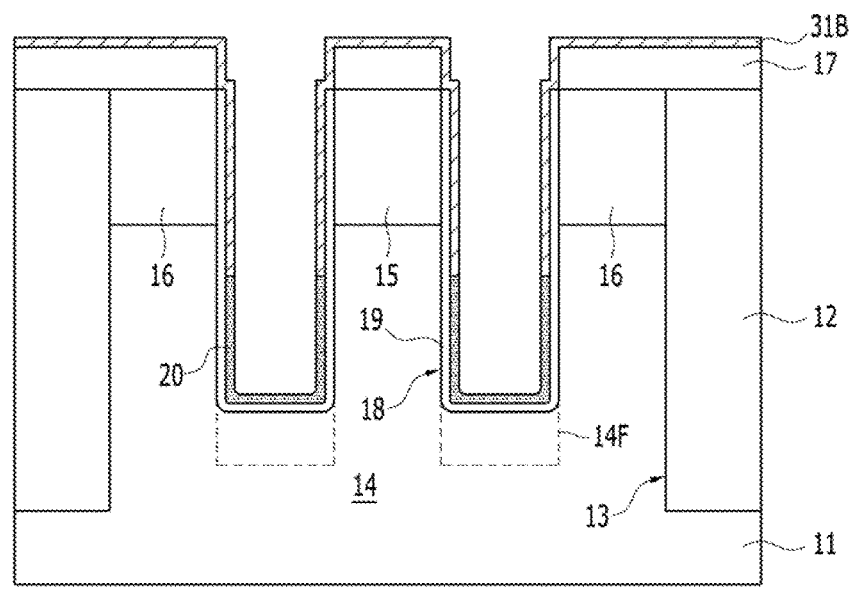

As shown in FIG. 9B a pre-second work function adjusting liner 31B may be formed.

The second work function adjusting liner layer 31A may be selectively removed by blanket. For example, the second work function adjusting liner layer 31A may be etched without using a mask or a sacrificial filler. Accordingly, the pre-second work function adjusting liner 31B that overlaps with the first and second doping regions 15 and 16 may be formed. The pre-second work function adjusting liner 318 may non-overlap with the first work function adjusting liner 20 when viewed in a horizontal direction. That is, the pre-second work function adjusting liner 31B may not cover the sidewalls of the first work function adjusting liner 20. The bottom portions of the pre-second work function adjusting liner 31B may contact the top portions of the first work function adjusting liner 20.

An etch-back process for the second work function adjusting liner layer 31A has an etching selectivity with respect to the first work function adjusting liner 20 and the gate dielectric layer 19. Accordingly, damage to the gate dielectric layer 19 is prevented.

Figure 9C:
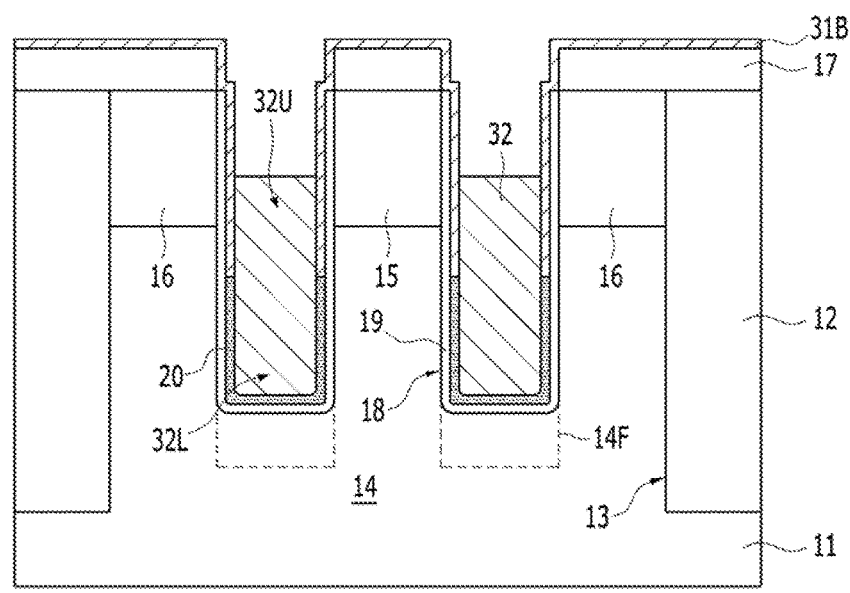

As shown in FIG. 9C, a buried portion 32 may be formed. To form the buried portion 32, a process for forming a pre-buried layer (not shown) and an etch-back process may be sequentially performed. The buried portion 32 may be at a level lower than the top surface of an active region 14. Accordingly, the buried portion 32 which is positioned or embedded in a gate trench 18 may be formed.

The buried portion 32 may include a first portion 32L and a second portion 32U. The first portion 32L may fill a lower portion of the gate trench 18. The second portion 32U may be positioned on the first portion 32L and overlap with the first and second doping regions 15 and 16. The first work function adjusting liner 20 may be positioned between the first portion 32L of the buried portion 32 and the gate dielectric layer 19 The pre-second work function adjusting liner 31B may be positioned between the second portion 32U of the buried portion 32 and the gate dielectric layer 19.

While forming the buried portion 32 as described above, a portion of the pre-second work function adjusting liner 31B may be exposed.

Figure 9D:
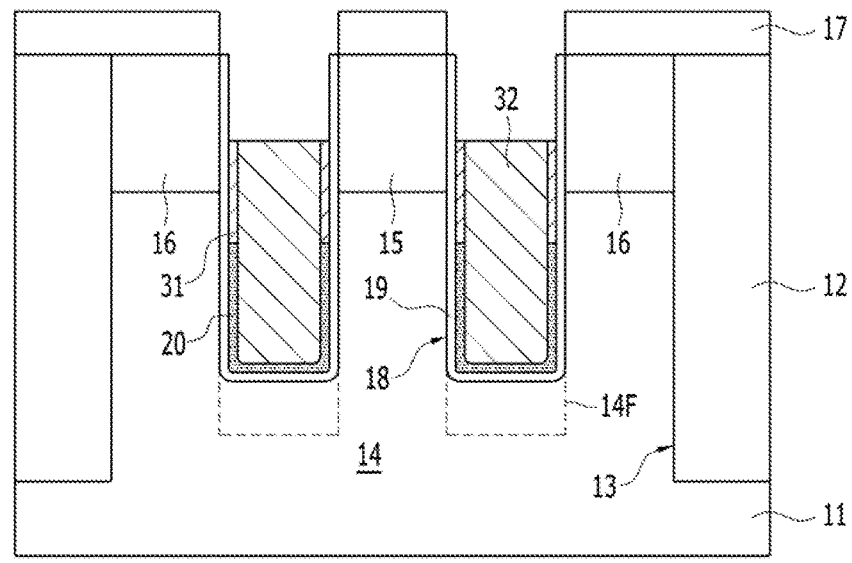

As shown in FIG. 9D, the pre-second work function adjusting liner 31B may be selectively removed. For example, the exposed portion of the pre-second work function adjusting liner 31B may be removed. Accordingly, a second work function adjusting liner 31 may be formed. A recessing process is performed such that the second work function adjusting liner 31 remains in the gate trench 18. The recessing process may be performed by dry etching or wet etching. The second work function adjusting liner 31 may be formed by an etch-back process for the pre-second work function adjusting liner 31B. The recessing process may be performed without an attack to the gate dielectric layer 19. The second work function adjusting liner 31 may be positioned between the buried portion 32 and the gate dielectric layer 19. The heights of the top surfaces of the second work function adjusting liner 31 and the buried portion 32 may be at the same level.

The second work function adjusting liner 31 may overlap with the first and second doping regions 15 and 16. The first work function adjusting liner 20 may not overlap with the first and second doping regions 15 and 16.

Figure 9E:
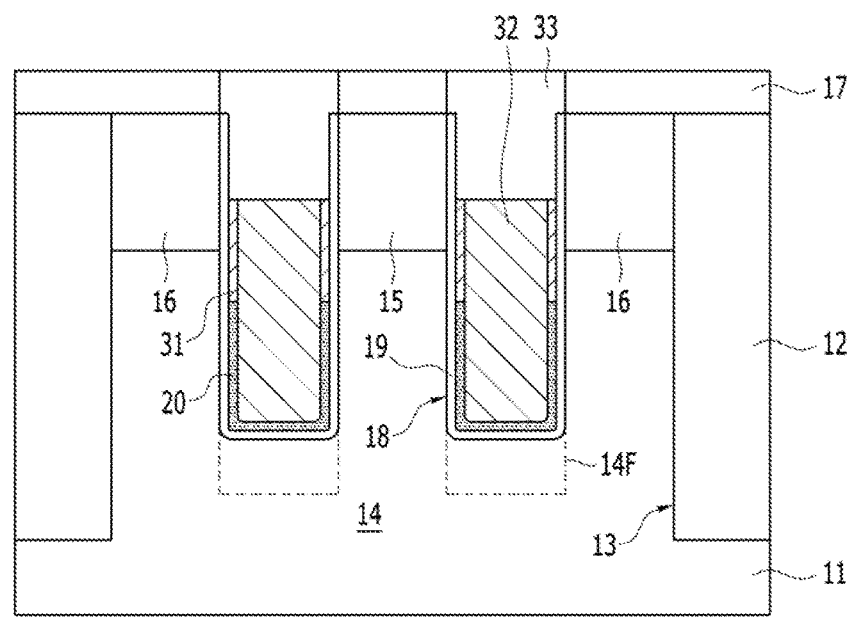

As shown in FIG. 9E, a capping layer 33 is formed on the buried portion 32. The capping layer 33 includes a dielectric material. On the buried portion 32, the gate trench 18 is filled with the capping layer 33. The capping layer 33 may include a silicon nitride. Subsequently, planarization of the capping layer 33 may be performed such that the top surface of a substrate 11 is exposed. In another embodiment, the capping layer 33 may include a silicon oxide. In still another embodiment, the capping layer 33 may be a nitride-oxide-nitride (NON) structure.

Figure 10:
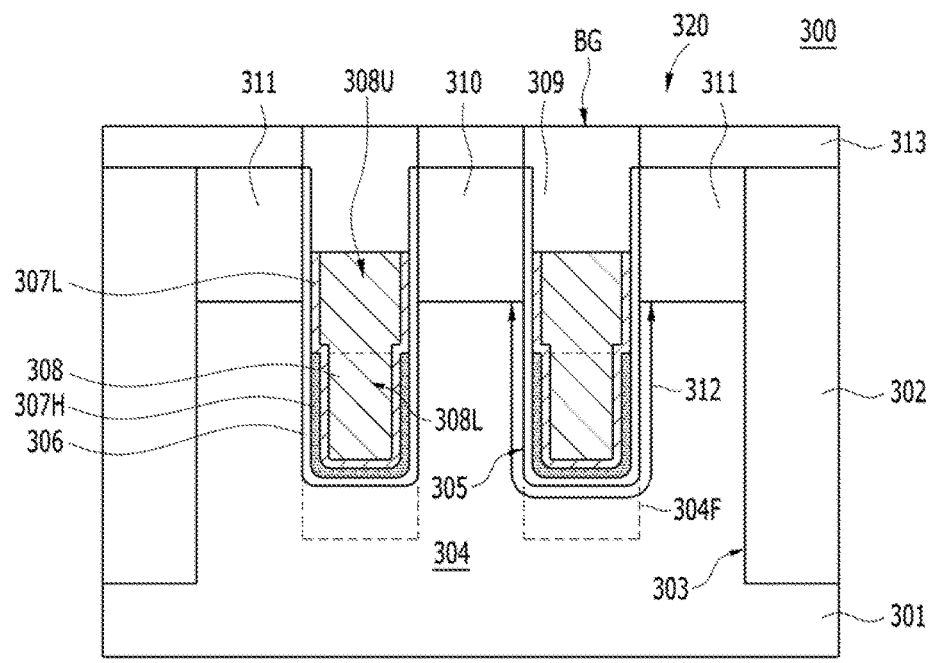
FIG. 10 is a view illustrating semiconductor structure in accordance with a third embodiment.

FIG. 10 is a view illustrating a semiconductor structure in accordance with a third embodiment. A transistor 320 is shown as a part of a semiconductor structure 300.

The semiconductor structure 300 may include a substrate 301. An isolation region 302 that defines an active region 304 may be formed in the substrate 301. The isolation region 302 may be a STI region. A buried gate structure BG may extend into the substrate 301. A gate trench 305 may be formed in the substrate 301. The gate trench 305 may be a line shape that traverses the active region 304 and the isolation region 302. The buried gate structure BG may be formed in the gate trench 305. The active region 304 may include a channel region 312, a first doping region 310 and a second doping region 311.

The semiconductor structure 300 may include a transistor. The following embodiments and modifications thereof may be applied to a non-planar transistor, for example, a buried gate type transistor.

The substrate 301 may be a material that is appropriate for semiconductor processing. The substrate 301 may include a semiconductor substrate. The substrate 301 may be formed of a silicon-containing material. The substrate 301 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 301 may include another semiconductor material such as germanium. The substrate 301 may include a III/V group semiconductor substrate, for example, a compound semiconductor substrate such as GaAs. The substrate 301 may include a silicon-on-insulator (SOT) substrate.

The isolation region 302 that defines the active region 304 may be formed in the substrate 301. The isolation region 302 may be a STI region. The isolation region 302 may be formed in an isolation trench 303.

The channel region 312 and the first and second doping regions 310 and 311 may be formed in the active region 304. The channel region 312 may include the gate trench 305. The gate trench 305 may be a line shape that extends in any one direction. The gate trench 305 may include a bottom and sidewalls. The boundary portions of the bottom and sidewalls may be rounded. The channel region 312 may include a fin region 304F. The fin region 304F may be positioned at the bottom of the gate trench 305. The fin region 304F may be formed as the isolation region 302 is recessed to be lower than the bottom of the gate trench 305. A channel width may be increased by the fin region 304F. The first and second doping regions 310 and 311 may be formed in the active region 304 on both sides of the gate trench 305. The first and second doping regions 310 and 311 are doped with a conductivity type dopant. For example, a conductivity type dopant may include phosphorus (P), arsenic (As), antimony (Sb) or boron (B). The first and second doping regions 310 and 311 may be doped with the same conductivity type dopant. The first and second doping regions 310 and 311 may be referred to as a source region and a drain region, respectively. The bottom surfaces of the first and second doping regions 310 and 311 may be positioned at a predetermined depth from the top surface of the substrate 301. The first and second doping regions 310 and 311 may contact the sidewalls of the gate trench 305. The bottom surfaces of the first and second doping regions 310 and 311 may be higher than the bottom surface of the gate trench 305. The first and second doping regions 310 and 311 may be symmetrical to each other. For example, the first and second doping regions 310 and 311 may form junctions of the same depth, that is, D1=D2.

The buried gate structure BG may be formed in the gate trench 305. The buried gate structure BG may be simply referred to as an embedded BG. The buried gate structure BG may be positioned in the gate trench 305 between the first and second doping regions 310 and 311.

The buried gate structure BG may include a first work function adjusting liner 307H, a gate electrode 308 and a second work function adjusting liner 307L. The buried gate structure BG may further include a gate dielectric layer 306 and a capping layer 309. The gate electrode 308 may be positioned at a level lower than the top surface of the substrate 301. The gate electrode 308 may partially fill the gate trench 305. Accordingly, the gate electrode 208 may be referred to as a 'buried gate electrode.' The capping layer 309 may be positioned on the gate electrode 308. The gate dielectric layer 306 may be formed on the bottom and sidewalls of the gate trench 305. The first work function adjusting liner 307H may be positioned between the gate electrode 308 and the gate dielectric layer 306.

The gate dielectric layer 306 may include a silicon oxide a silicon nitride, a silicon oxynitride, a high-k material or a combination thereof. A high-k material may include a material that has a dielectric constant higher than the dielectric constant of a silicon oxide. For example, a high-k material may include a material that has a dielectric constant higher than 3.9. For another example, a high-k material may include a material that has a dielectric constant higher than 10. For still another example, a high-k material may include a material that has a dielectric constant of 10 to 30. A high-k material may include at least one metallic element, A high-k material may include a hafnium containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used. As the gate dielectric layer 306, an appropriate material may be selected according to the first work function adjusting liner 307H. For example, as the gate dielectric layer 306, a material that has a lower dielectric constant than the first work function adjusting liner 307H may be selected.

The channel length of the channel region 312 may be lengthened by the gate trench 305. The channel region 312 according to the present embodiment has a longer channel length than a conventional planar type transistor. Therefore, a short channel effect may be substantially prevented.

The gate electrode 308 may include a first buried portion 308L and a second buried portion 308U. The first buried portion 308L may fill the lower portion of the gate trench 305 and the second buried portion 308U may fill the gate trench 305 on the first buried portion 308L. The first buried portion 308L may overlap with the channel region 312. A portion of the second buried portion 308U may overlap with the channel region 312, and the other portion of the second buried portion 308U may overlap with the first and second doping regions 310 and 311. Here, the overlap may be in a horizontal direction. The height of the top surface of the second buried portion 308U may be a level lower than the top surface of the substrate 301. The first buried portion 308L and the second buried portion 308U are the same material, and may be a low resistivity metal-base material. The first buried portion 308L and the second buried portion 308U are distinguished for the sake of convenience in description. The first buried portion 308L and the second buried portion 308U may be an integral type. The gate electrode 308 may include a low resistivity metal. The gate electrode 308 may include tungsten (W), aluminum (Al) or a combination thereof.

The first work function adjusting liner 307H may be positioned between the first buried portion 308L of the gate electrode 308 and the gate dielectric layer 306. The top surfaces of the first work function adjusting liner 307H and the first buried portion 308L may be at the same level. The second work function adjusting liner 307L may be positioned between the second buried portion 308U and the gate dielectric layer 306. The top surfaces of the second work function adjusting liner 307L and the second buried portion 308U may be at the same level.

The first work function adjusting liner 307H and the second work function adjusting liner 307L may have a U shape. The top portions of the first work function adjusting liner 307H may be separated from the first and second doping regions 310 and 311. The second work function adjusting liner 307L may cover the first work function adjusting liner 307H.

The capping layer 309 may be filled on the second buried portion 308U. The capping layer 309 plays the role of protecting the gate electrode 308. The capping layer 309 may include a dielectric material. The capping layer 309 may include a silicon nitride, a silicon oxynitride or a combination thereof. In another embodiment, the capping layer 309 may include a combination of a silicon nitride and a silicon oxide. For example, to form the capping layer 309, lining may be performed using a silicon nitride, and thereafter, a spin-on-dielectric (SOD) may be filled. In still another embodiment, the capping layer 309 may be a tri-layer including N(nitride)-O(oxide)-N(nitride).

A hard mask layer 313 may be formed on the first and second doping regions 310 and 311. The hard mask layer 313 may be extended to cover the top of the isolation region 302. The hard mask layer 313 may include a silicon oxide such as a tetra-ethyl-ortho-silicate (TEOS).

The first work function adjusting liner 307H and the second work function adjusting liner 307L will be described below in detail.

The first and second work function adjusting liners 307H and 307L may be dielectric materials. Accordingly, the resistivity of the buried gate structure BG may be reduced. The first and second work function adjusting liners 307H and 307L may be high-k materials that have dielectric constants higher than the gate dielectric layer 306. The first work function adjusting liner 307H may induce a high work function between the first buried portion 308L and the channel region 312. The second work function adjusting liner 307L may induce a low work function between the second buried portion 308U and the first and second doping regions 310 and 311. The first work function adjusting liner 307H may generate a dipole that induces a high work function, between the channel region 312 and the first buried portion 308L. The second work function adjusting liner 307L may generate a dipole that induces a low work function, between the first and second doping regions 310 and 311 and the second buried portion 308U.

To generate the dipole, the first work function adjusting liner 307H and the gate dielectric layer 306 may have different dielectric constant. The first work function adjusting liner 307H may be formed of a higher dielectric constant metal oxide that has a dielectric constant higher than the gate dielectric layer 306. The second work function adjusting liner 307L may be formed of a higher dielectric constant metal oxide that has a dielectric constant higher than the gate dielectric layer 306. When the gate dielectric layer 306 is $SiO_2$, the first work function adjusting liner 307H may include a material that has a dielectric constant higher than $SiO_2$. When the gate dielectric layer 306 is $SiO_2$, the second work function adjusting liner 307L may include a material that has a dielectric constant higher than $SiO_2$. The first work function adjusting liner 307H may include an aluminum oxide ($Al_2O_3$), a titanium oxide ($TiO_2$), a hafnium oxide ($HfO_2$), a zirconium oxide ($ZrO_2$) or a magnesium oxide (MgO). The second work function adjusting liner 307L may include an yttrium oxide ($Y_2O_3$), a lanthanum oxide ($La_2O_3$), a germanium oxide ($GeO_2$), a lutetium oxide ($Lu_2O_3$) or a strontium oxide (SrO). The first and second work function adjusting liners 307H and 307L may be formed to a thin thickness. Therefore, it is possible to significantly decrease the resistivity of the gate electrode 308 by increasing the volume of the gate electrode 308.

According to the third embodiment, the first work function adjusting liner 307H is a material that induces a high work function. A threshold voltage is modulated by the first work function adjusting liner 307H. For example, a threshold voltage may be shifted by the first work function adjusting liner 307H. The dipole may be generated at the interface of the first work function adjusting liner 307H and the gate dielectric layer 306. The dipole may be generated by a difference of oxygen areal densities between the first work function adjusting liner 307H and the gate dielectric layer 306. Such a dipole may induce a high work function between the first buried portion 308L of the gate electrode 308 and the channel region 312. Accordingly, the dipole may shift a threshold voltage. As a result, the channel dose of the channel region 312 may be decreased by the first work function adjusting liner 307H. When the second work function adjusting liner 307L has a dielectric constant higher than the gate dielectric layer 306, the dipole may be generated in a direction where a low work function is induced between the second buried portion 308U and the first and second doping regions 310 and 311. Accordingly, GIDL may be improved.

Since a threshold voltage may be modulated by the first work function adjusting liner 3071-1, a dose of local channel doping (LCI) may be significantly decreased or local channel doping (LCI) may be omitted. Hence, in the present embodiment, since a channel dose may be decreased, a junction leakage characteristic may be improved.

Additionally, since the second work function adjusting liner 307L is included, it is possible to suppress gate-induced drain leakage (GIDL) in the first and second doping regions 310 and 311.

Figure 11:
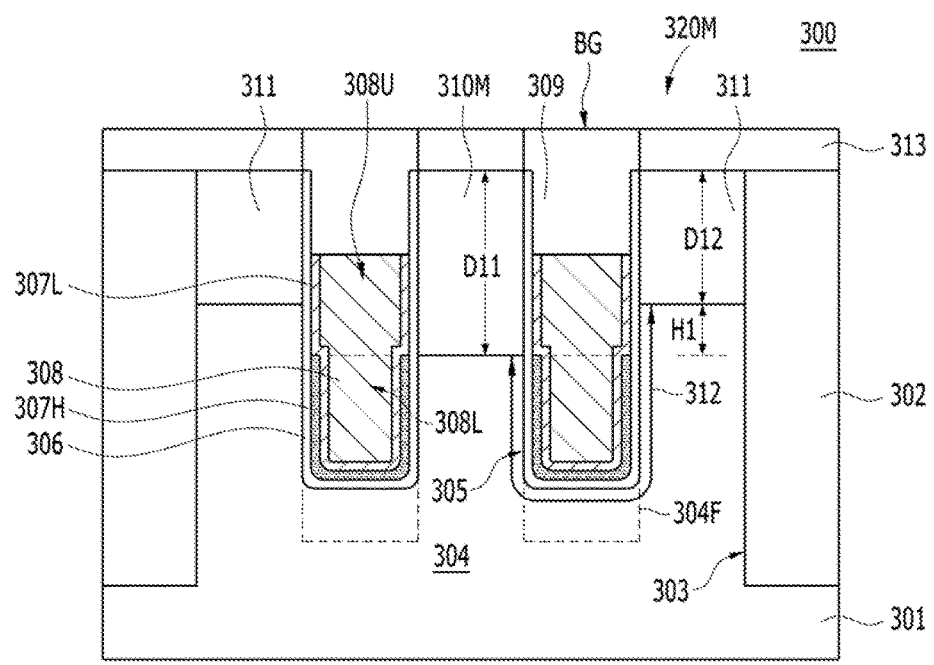
FIG. 11 illustrates a semiconductor structure in accordance with a modification of the third embodiment.

FIG. 11 illustrates a semiconductor structure 300 in accordance with a modification of the third embodiment.

Referring to FIG. 11, a transistor 320M is shown as a part of the semiconductor structure 300. Components of the semiconductor structure 200 shown in FIG. 11 may be the same as those of the semiconductor structure 300 described with reference to FIG. 10 except for a first doping region 310M.

The transistor 320M may include the first doping region 310M and a second doping region 311. The first and second doping regions 310M and 311 may be an asymmetrical structure. The first doping region 310M may form a deeper junction than the second doping region 311, and the second doping region 311 may form a shallower junction than the first doping region 310M. For example, the first doping region 310M may be formed to a first depth D11, and the second doping region 311 may be formed to a second depth D12. The first depth DII may be deeper than the second depth D12. The first doping region 310M may overlap with a second buried portion 308U of a gate electrode 308 and a second work function adjusting liner 307L. The first and second doping regions 310M and 311 may overlap with the second work function adjusting liner 307L. The first and second doping regions 310M and 311 may non-overlap with a first work function adjusting liner 307H. The first work function adjusting liner 307H may be separated by a first height H1 from the second doping region 311.

Figure 12:
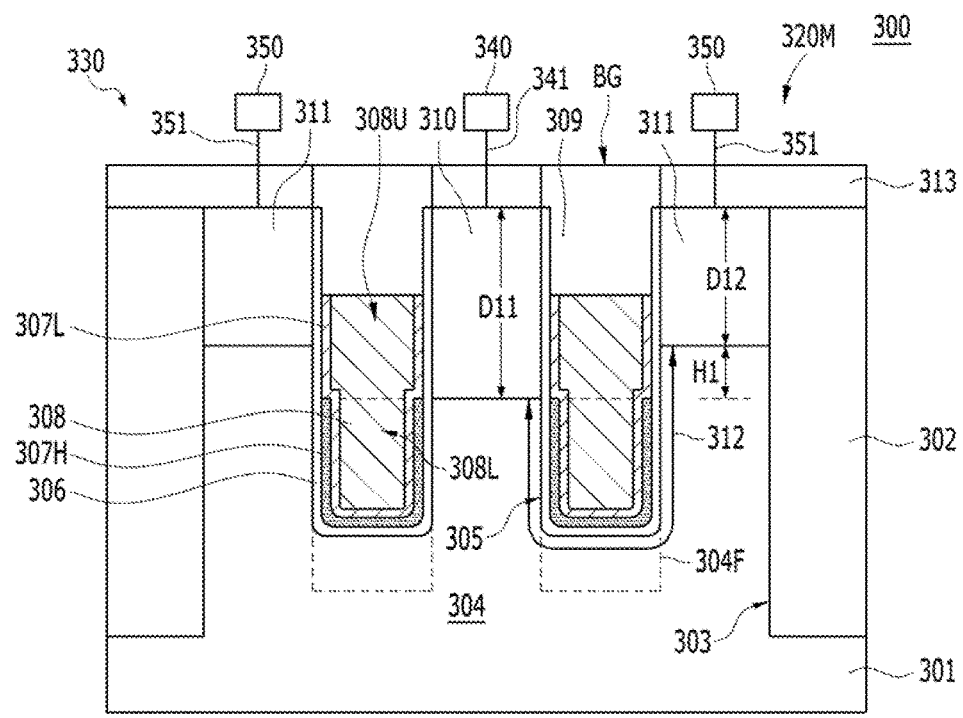
FIG. 12 is a view illustrating an application of the semiconductor structure in accordance with the third embodiment.

FIG. 12 is a view illustrating an application of the semiconductor structure in accordance with the third embodiment.

Referring to FIG. 12, a memory cell 330 is shown as a part of a semiconductor structure 300. The memory cell 330 may include a transistor 320M, a bit line 340, and a memory element 350. The transistor 320M may be the transistor 320M of FIG. 11. Therefore, the transistor 320M may include a buried gate structure BG, a first doping region 310M and a second doping region 311. The first doping region 310M may be electrically coupled to the bit line 340 through a first contact 341. The second doping region 311 may be electrically coupled to the memory element 350 through a second contact 351. The memory element 350 may include a capacitor. The buried gate structure BG may be referred to as a buried word line structure BWL.

The transistor 320M may be replaced with the transistor 320 described with reference to FIG. 10.

FIGS. 13A to 13E illustrate a method for manufacturing the semiconductor structure in accordance with the third embodiment.

As shown in FIGS. 5A to 5F, a work function adjusting liner 20 may be formed through a series of processes. Hereinbelow, in the third embodiment, the work function adjusting liner 20 will be referred to as a first work function adjusting liner 20. By the first work function adjusting liner 20, a dipole interface that induces a high work function may be formed between a buried portion and a channel. Accordingly, the first work function adjusting liner 20 may be referred to as a high work function inducing material or a first dipole forming material.

Figure 13A:
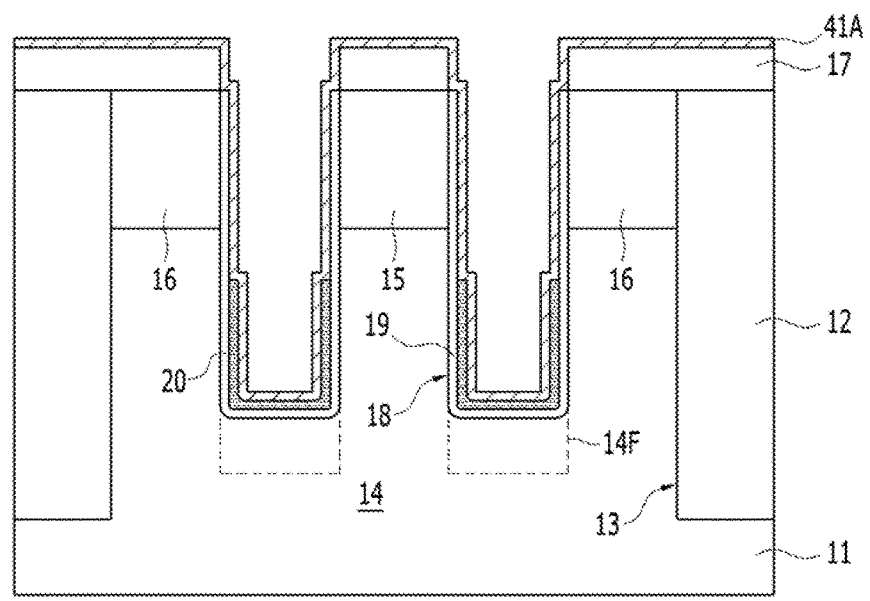
FIGS. 13A to 13E illustrate a method for manufacturing the semiconductor structure in accordance with the third embodiment.

As shown in FIG. 13A, a second work function adjusting liner layer 41A may be formed on the first work function adjusting liner 20. The second work function adjusting liner layer 41A may be a material that is different from the first work function adjusting liner 20. By the second work function adjusting liner layer 41A, a dipole interface that induces a low work function may be formed between the buried portion and first and second doping regions 15 and 16. The second work function adjusting liner layer 41A may include a dielectric material. The second work function adjusting liner layer 41A may be a material that has a dielectric constant higher than a gate dielectric layer 19.

Figure 13B:
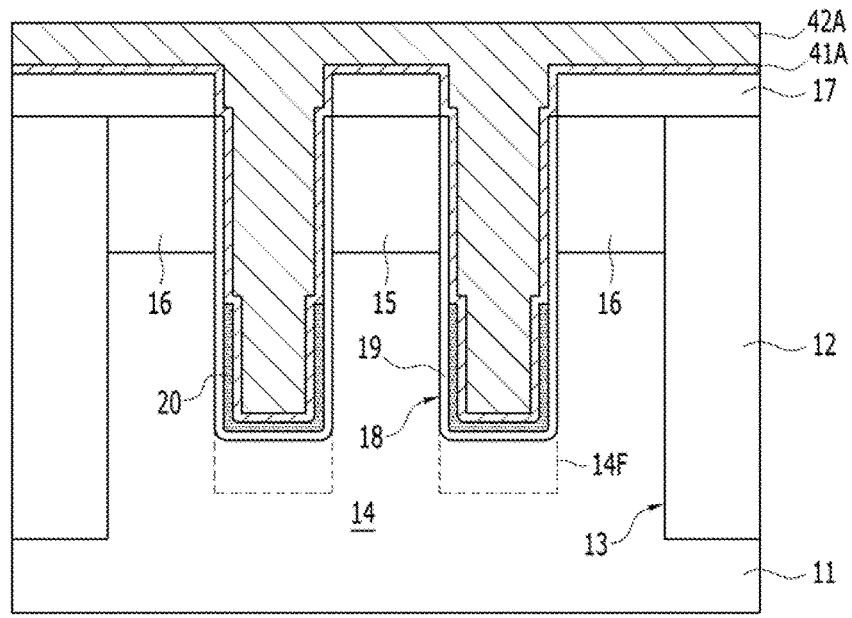

As shown in FIG. 13B, a pre-buried layer 42A may be formed.

Figure 13C:
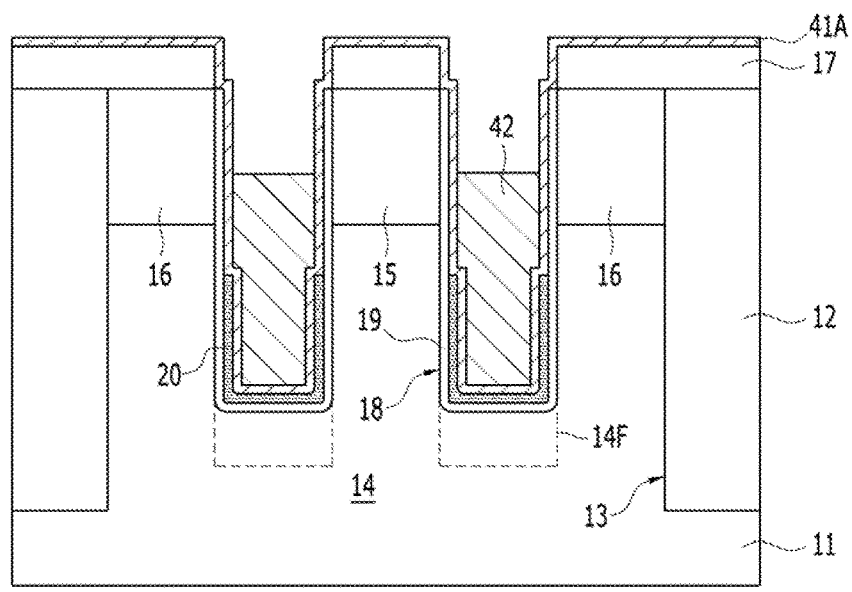

As shown in FIG. 13C, an etch-back process for the pre-buried layer 42A may be performed, thus, a buried portion 42 may be formed. The buried portion 42 may be a level lower than the top surface of an active region 14. Accordingly, the buried portion 42 which is positioned or embedded in a gate trench 18 may be formed.

While forming the buried portion 42 as described above, a portion of the second work function adjusting liner layer 41A may be exposed.

Figure 13D:
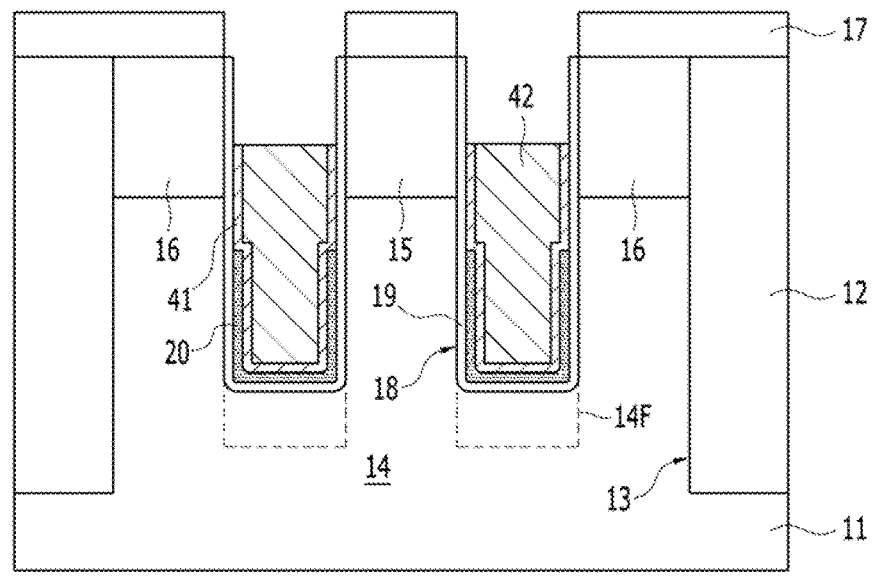

As shown in FIG. 13D, the second work function adjusting liner layer 41A may be selectively removed. For example, the exposed portion of the second work function adjusting liner layer 41A may be removed. Accordingly, a second work function adjusting liner 41 may be formed. A recessing process is performed such that the second work function adjusting liner 41 remains in the gate trench 18. The recessing process may be performed by dry etching or wet etching. The second work function adjusting liner 41 may be formed by an etch-back process for the second work function adjusting liner layer 41A. The recessing process may be performed without an attack to the gate dielectric layer 19. The second work function adjusting liner 41 may be positioned between the buried portion 42 and the gate dielectric layer 19. The heights of the top surfaces of the second work function adjusting liner 41 and the buried portion 42 may be at the same level. The second work function adjusting liner 41 may entirely cover the first work function adjusting liner 20.

The second work function adjusting liner 41 may overlap with the first and second doping regions 15 and 16.

Figure 13E:
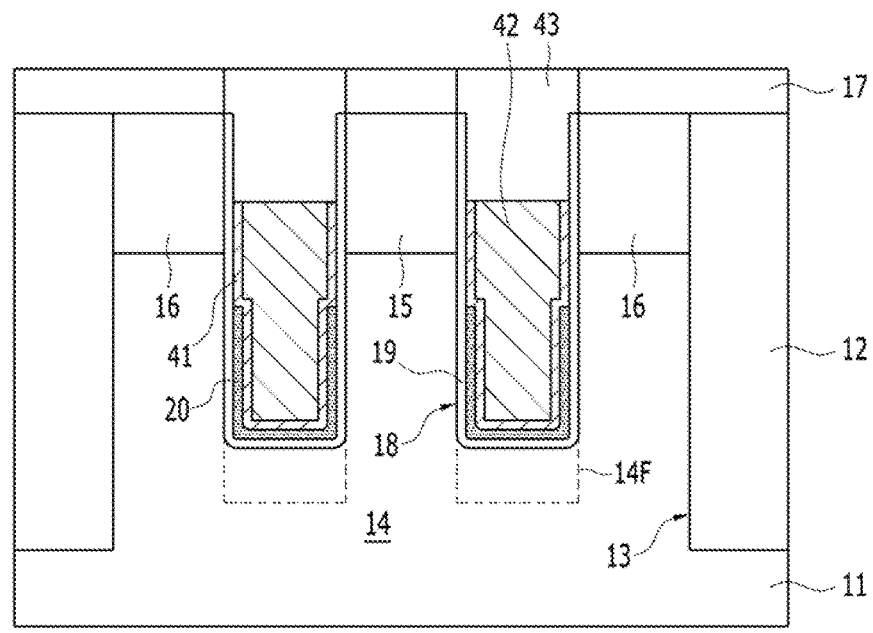

As shown in FIG. 13E, a capping layer 43 is formed on the buried portion 42. The capping layer 43 includes a dielectric material. On the buried portion 42, the gate trench 18 is filled with the capping layer 43. The capping layer 43 may include a silicon nitride. Subsequently, planarization of the capping layer 43 may be performed such that the top surface of a substrate 11 is exposed. In another embodiment, the capping layer 43 may include a silicon oxide. In still another embodiment, the capping layer 43 may be a nitride-oxide-nitride (NON) structure.

The semiconductor devices according to the above-described embodiments may be applied to a dynamic random access memory (DRAM), and, without being limited to this, may also be applied to a memory such as a static random access memory (SRAM), a flash memory, a ferroelectric random access memory (FeRAM), a magnetic random access memory (MRAM) and a phase change random access memory (PRAM).

In the present technology, loss of a gate dielectric layer that overlaps with doping regions may be prevented by a liner layer.

Further, in the present technology, since a dipole that induces a high work function is formed at an interface of a gate dielectric layer and a buried gate electrode, a channel dose may be decreased and junction leakage may be reduced.

Moreover, in the present technology, since a low work function material or a dipole capable of making a change to a low work function is formed between the buried gate electrode and doping regions, gate-induced drain leakage (GIDL) may be reduced.

Although various embodiments have been described for illustrative purposes, it will be apparent to those skilled in the art that various changes and modifications may be made without departing from the spirit and/or scope of the invention as defined in the following claims.

What is claimed is:

1. A method for forming a semiconductor structure, comprising:
   forming a first doping region, a second doping region and a trench between the first and second doping regions in a semiconductor substrate;
   forming a gate dielectric layer over a surface of the trench;
   forming a dielectric liner layer over the gate dielectric layer;
   forming a sacrificial layer which fills the trench, over the dielectric liner layer;
   etching the sacrificial layer and the dielectric liner layer, and forming a sacrificial filler and a dielectric liner that are positioned in the trench;
   removing the sacrificial filler;
   forming a conductive layer which fills the trench, over the dielectric liner and the gate dielectric layer; and
   recessing the conductive layer, and forming a gate electrode that is buried in the trench.

2. The method according to claim 1,
   wherein the gate dielectric layer and the dielectric liner layer comprise materials that contain oxygen, and
   wherein the dielectric liner layer comprises a material that has a higher dielectric constant than the gate dielectric layer.

3. The method according to claim 1,
   wherein the gate dielectric layer comprises a silicon oxide ($SiO_2$) and the dielectric liner layer comprises a high-k material, and
   wherein the dielectric liner layer comprises a material that has a higher dielectric constant than the silicon oxide.

4. The method according to claim 1,
   wherein the dielectric liner layer comprises a high work function inducing material.

5. The method according to claim 1, wherein the dielectric liner layer comprises an aluminum oxide ($Al_2O_3$), a titanium oxide ($TiO_2$), a hafnium oxide ($HfO_2$), a zirconium oxide ($ZrO_2$) or a magnesium oxide (MgO).

6. The method according to claim 1, wherein the forming of the sacrificial filler comprises:
   forming the sacrificial layer which fills the trench, over the dielectric liner layer; and
   recessing the sacrificial layer to form the sacrificial filler.

7. The method according to claim 1, wherein the removing of the sacrificial filler is performed using a wet etching or a dry etching.

8. The method according to claim 1, wherein the sacrificial layer comprises a polysilicon, a metal, a silicon germanium or a combination thereof.

9. A method for forming a semiconductor structure, comprising:
   forming a hard mask layer over a semiconductor substrate;
   etching the semiconductor substrate by using the hard mask layer as a barrier, and forming a trench;
   forming a gate dielectric layer over a surface of the trench;
   forming a first dielectric liner layer over the gate dielectric layer and the hard mask layer;
   forming a sacrificial layer which fills the trench, over the first dielectric liner layer;
   etching the sacrificial layer and the first dielectric liner layer, and forming a sacrificial filler and a first dielectric liner that are positioned in the trench;
   removing the sacrificial filler;
   forming a second dielectric liner layer over the first dielectric liner and the gate dielectric layer;
   etching the second dielectric liner layer, and forming a second dielectric liner;
   forming a metal-base material that contacts the first dielectric liner and the second dielectric liner and fills the trench and
   recessing the meta base material and forming a gate electrode that is buried in the trench.

10. The method according to claim 9,
    wherein the first dielectric liner layer and the second dielectric layer comprises a material that has a higher dielectric constant than the gate dielectric layer.

11. The method according to claim 9,
    wherein the first dielectric liner layer comprises a high work function inducing material, and
    wherein the second dielectric liner layer comprises a low work function inducing material.

12. The method according to claim 9, wherein the gate dielectric layer comprises a silicon oxide ($SiO_2$), and the first dielectric liner layer comprises an aluminum oxide ($Al_2O_3$), a titanium oxide ($TiO_2$), a hafnium oxide ($HfO_2$), a zirconium oxide ($ZrO_2$) or a magnesium oxide (MgO).

13. The method according to claim 9,
    wherein the gate dielectric layer comprises a silicon oxide ($SiO_2$), and
    wherein the second dielectric liner layer comprises an yttrium oxide ($Y_2O_3$), a lanthanum oxide ($La_2O_3$) a germanium oxide ($GeO_2$) a lutetium oxide ($Lu_2O_3$) or a strontium oxide (SrO).

14. The method according to claim 9, wherein the sacrificial layer comprises a polysilicon, a metal, a silicon germanium or a combination thereof.

15. A method for forming a semiconductor structure, comprising:
    forming a hard mask layer over a semiconductor substrate;

etching the semiconductor substrate by using the hard mask layer as a barrier, and forming a trench;
forming a gate dielectric layer over a surface of the trench;
forming a first dielectric liner layer over the gate dielectric layer and the hard mask layer;
forming a sacrificial layer which fills the trench, over the first dielectric liner layer;
etching the sacrificial layer and the first dielectric liner layer, and forming a sacrificial filler and a first dielectric liner that are positioned in the trench;
removing the sacrificial filler;
forming a second dielectric liner layer over the first dielectric liner and the gate dielectric layer;
forming a metal-base material which fills the trench, over the second dielectric liner layer; and
etching the metal-base material and the second dielectric liner layer, and forming a gate electrode and a second dielectric liner that are buried in the trench.

16. The method according to claim 15,
wherein the first dielectric liner layer and the second dielectric liner layer comprises a material that has a higher dielectric constant than the gate dielectric layer.

17. The method according to claim 15,
wherein the first dielectric liner layer comprises a high work function inducing material, and
wherein the second dielectric liner layer comprises a low work function inducing material.

18. The method according to claim 15, wherein the gate dielectric layer comprises a silicon oxide ($SiO_2$), and the first dielectric liner layer comprises an aluminum oxide ($Al_2O_3$), a titanium oxide ($TiO_2$), a hafnium oxide ($HfO_2$), a zirconium oxide ($ZrO_2$) or a magnesium oxide (MgO).

19. The method according to dam 15, wherein the gate dielectric layer comprises a silicon oxide ($SiO_2$), and the second dielectric liner layer comprises an yttrium oxide ($Y_2O_3$), a lanthanum oxide ($La_2O_3$), a germanium oxide ($GeO_2$), a lutetium oxide ($Lu_2O_3$) or a strontium oxide (SrO).

20. The method according to claim 15, wherein the sacrificial layer comprises a polysilicon, a metal, a silicon germanium or a combination thereof.

* * * * *